United States Patent [19]

Kusuda et al.

[11] Patent Number: 5,177,405
[45] Date of Patent: Jan. 5, 1993

[54] SELF-SCANNING, LIGHT-EMITTING DEVICE

[75] Inventors: Yukihisa Kusuda; Kiyoshi Tone, both of Tsukuba; Ken Yamashita, Tsuchiura; Shuhei Tanaka, Tsukuba; Seiji Ohno, Tsukuba; Yasunao Kuroda, Tsukuba; Nobuyuki Komaba, Tsukuba, all of Japan

[73] Assignee: Nippon Sheet Glass Co., Ltd., Tokyo, Japan

[21] Appl. No.: 557,389

[22] Filed: Jul. 24, 1990

[30] Foreign Application Priority Data

Jul. 25, 1989 [JP] Japan ............... 1-192161
Apr. 23, 1990 [JP] Japan ............... 2-106932

[51] Int. Cl.⁵ .......... G09G 3/10; G09G 3/32; H05B 41/16
[52] U.S. Cl. ............... 315/169.1; 340/782; 340/766; 307/13; 307/461; 315/147

[58] Field of Search ............ 340/782, 762, 766, 719; 357/17, 38, 30 H, 30 O, 30 G, 30 P; 358/475, 482, 483; 307/13, 461, 464; 315/169.1, 147; 377/104

[56] References Cited

U.S. PATENT DOCUMENTS 2,856,544 10/1958 Ross .................... 377/104
3,991,359 11/1976 Thompson et al. ........... 307/13
4,829,357 5/1989 Kasahara ................. 357/17

Primary Examiner—Paul M. Dzierzynski
Assistant Examiner—Michael B. Shingleton
Attorney, Agent, or Firm—Parmelee, Bollinger & Bramblett

[57] ABSTRACT

A self-scanning, light-emitting device comprises an array of cells or blocks each having a self-scanning transfer element and a light-emitting element. Turn-on state of the transfer element is transferred to the subsequent transfer element in synchronism with clock pulses. Each light-emitting element is connected to the corresponding transfer element so as to emit light upon supplying current under an ON state of the transfer element. The light-emitting array generates a light image in accordance with a light emission current.

20 Claims, 25 Drawing Sheets

TRANSFER DIRECTION

SELF-SCANNING, LIGHT-EMITTING DEVICE

BACKGROUND OF THE INVENTION

1. Field of the Invention

The present invention relates to a light-emitting device comprising a plurality of cells or blocks integrally formed on a single substrate and each having a light emitting element and a transfer element having a self-scanning function and, more particularly, to a light-emitting device which realizes a long life and therefore can be applied to an optical printer or the like.

2. Description of the Prior Art

An LED (Light-Emitting Diode) and an LD (Laser Diode) are known as typical light-emitting elements.

In the LED, a PN or PIN junction made of a compound semiconductor (e.g., GaAs, GaP, AlGaAs, InGaAsP, or InGaAlAs) is formed. When a forward voltage is applied to the junction to inject carriers into the junction, the LED emits light during recombination.

The LD has a structure in which a waveguide is formed inside the LED.

As the light-emitting element, a negative resistive element (e.g., a light-emitting thyristor or a laser thyristor) having a light emission function is known. The light-emitting thyristor forms a pnpn structure on the compound semiconductor.

A large number of the LEDs are formed on a compound semiconductor substrate or wafer and cut into individual chips, or strips including aligned LED cells. When the chips or strips are applied as a light source for a LED printer, a read point and a write point of address to a medium such as paper must be designated in the array. For this reason, a function of scanning light emission points with the light-emitting elements is required.

In order to perform optical scanning by using these conventional light-emitting elements, a plurality of the LED chips is soldered on the base with a predetermined pitch in alignment with the scanning direction to provide an LED array and each LED must be connected to a driving IC by a technique such as wire bonding so that the IC drives the LED. Therefore, if the number of LEDs is large, the same large number of wire bonding are required which increase manufacturing cost. As a result, a wide area for installing the driving ICs is required which makes it difficult to form a compact device. In addition, since the pitch between the ICs is determined by the wire bonding technique, it is difficult to arrange the LEDs with a small pitch.

The present inventors applied a self-scanning function to a light-emitting array as shown in FIGS. 1 to 9 to overcome the above problems (U.S. patent application Ser. No. 324,197).

The light-emitting array uses a light emitting element which can control a turn-on threshold level of the adjacent light-emitting element. Transfer of light emission in the scanning direction of the array is realized on the basis of a principle in that a change in turn-on threshold level caused upon turn-on of one element is propagates to the next element in the scanning direction. Therefore, at least one element in the array is always turned on to emit light. At this time, although a light emission amount can be controlled, a current capable of maintaining the ON state must be supplied to the element.

That is, the self-scanning type light-emitting array as described above cannot be suitably applied to an optical printer which forms printing image by light emission of pixels. That is, elements to emit light and those not to emit light in the light-emitting array cannot be set in accordance with a printing image. A series of light emission required for self-scanning of the light-emitting array appears as a fog on the printing surface and degrades the resolution of the printed image.

In addition, since a turn-on time of each element of the self-scanning light-emitting array is a fraction of the number of elements in a line, a sufficient light amount required for printing cannot be obtained. For example, when one line of a light-emitting array consists of 1,000 elements, a light emission time of one element is 1/1,000 of a scanning time of the line.

SUMMARY OF THE INVENTION

It is an object of the present invention to provide a light-emitting device comprising a plurality of cells or blocks each having transfer and light emitting elements which can select only required elements in a light-emitting array to emit light.

It is another object of the present invention to sufficiently prolong a light emission time of each element in a light-emitting array.

In order to achieve the above objects of the present invention, there is provided a light-emitting device comprising:

a) a self-scanning transfer array including transfer elements, turn-on threshold levels of which are able to be controlled, coupling means for coupling the neighboring transfer elements so that an ON state transfer element has an influence to change the threshold level of the adjacent transfer element which is to be turned on next, and drive means, connected to the transfer elements to supply parallel drive pulses thereto, for transferring turn-on in the array direction at an interval of drive pulses while propagating a change in threshold level in the array direction; and b) a light-emitting array of light emitting elements, each having a control electrode capable of controlling a turn-on threshold level and a current electrode for receiving the current for light emission, wherein the transfer element is connected to the control electrode of the light-emitting element so that the light-emitting element is turned on upon turn-on of the transfer element to emit light in accordance with the current, and an ON state is self-maintained.

According to the present invention, a light emission image can be written in the light-emitting array. Light emission required for scanning does not have to interfere with an image. The duty ratio of turn-on of each light-emitting element may be increased to be larger than the fraction of the number of elements in one line and can be a maximum of 1.

Other and further objects, features and advantages of the invention will appear more fully from the following description.

DESCRIPTION OF THE PREFERRED EMBODIMENTS

For better understanding of the present invention, self-scanning light-emitting array according to the above U.S. patent application Ser. No. 324,197 will be described in detail with reference to FIGS. 1 to 9.

As described above, a light-emitting thyristor can be used as a constituting element of a light-emitting array.

Figure 1:
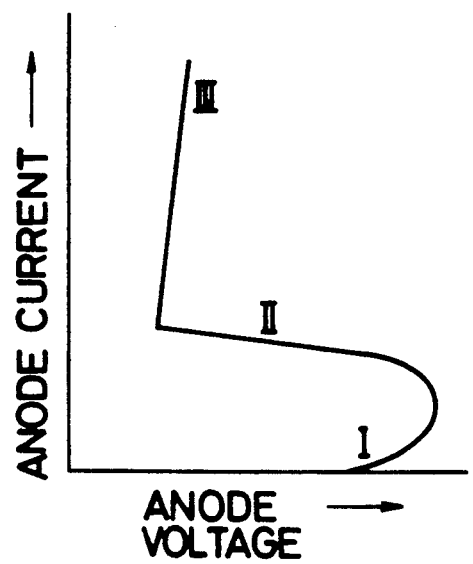
FIG. 1 is a graph showing current-voltage characteristics of a conventional light-emitting element.
Figure 2:
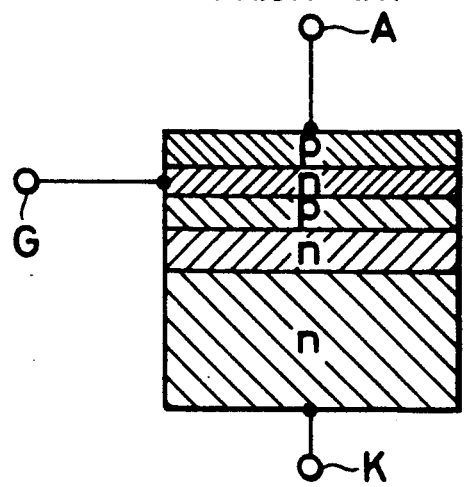
FIG. 2 is a schematic sectional view showing a structure of a conventional 3-terminal light-emitting element.
Figure 3:
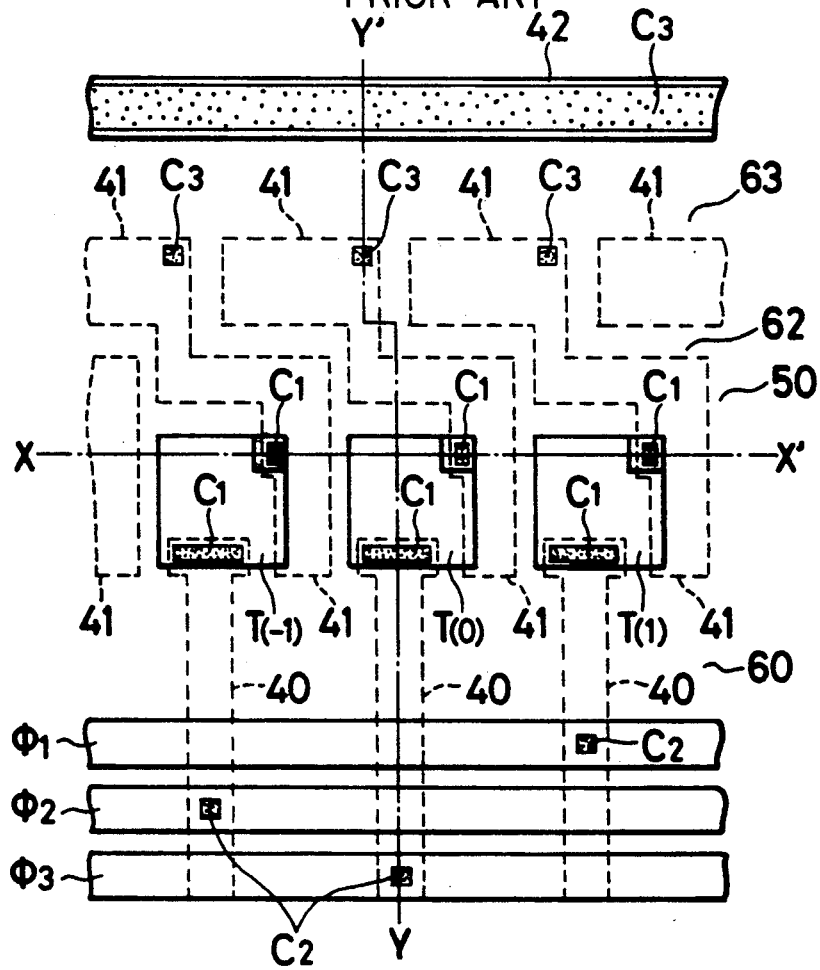
FIG. 3 is a plan view showing a structure of a light-emitting array.

FIG. 1 shows current-voltage characteristics of the light-emitting thyristor, and FIG. 2 shows its basic structure which has a pnpn structure formed on an n-type GaAs substrate. FIG. 1 shows a relationship between an anode voltage and an anode current when a gate G is open. The gate G controls an ON voltage of the thyristor which is a sum of a gate voltage and a diffusion voltage. Therefore, the ON voltage shown in FIG. 1 can be freely controlled by the gate voltage. After the thyristor is turned on, the gate voltage substantially coincides with the cathode voltage and the cathode is grounded, the gate G has 0 V. In addition, it is known that the ON voltage of this light-emitting thyristor is reduced when light is externally incident thereon. A laser thyristor can be formed by forming a waveguide in the above light-emitting thyristor in accordance with the same principle as that of an LD (Y. Tashiro et. al., Appl. Phys. Lett. 54(4), 1989 pp. 329–331).

Figure 4:
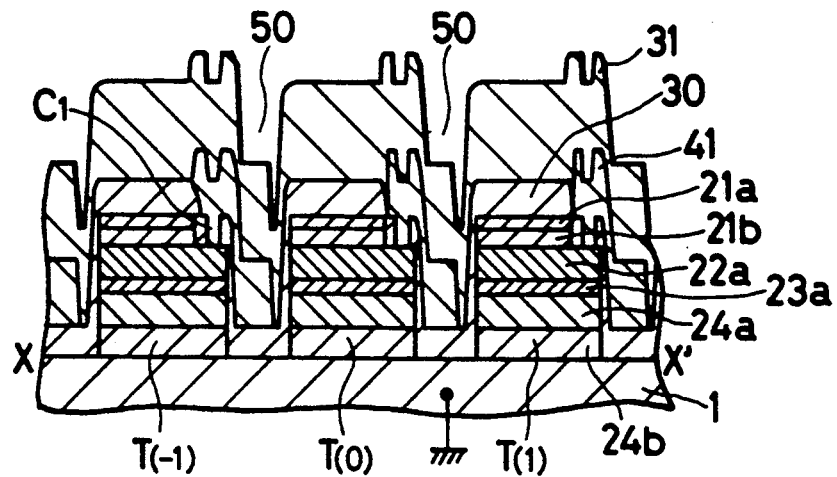
FIGS. 4 and 5 are sectional views taken along lines X—X' and Y—Y' of FIG. 3 respectively.
Figure 5:
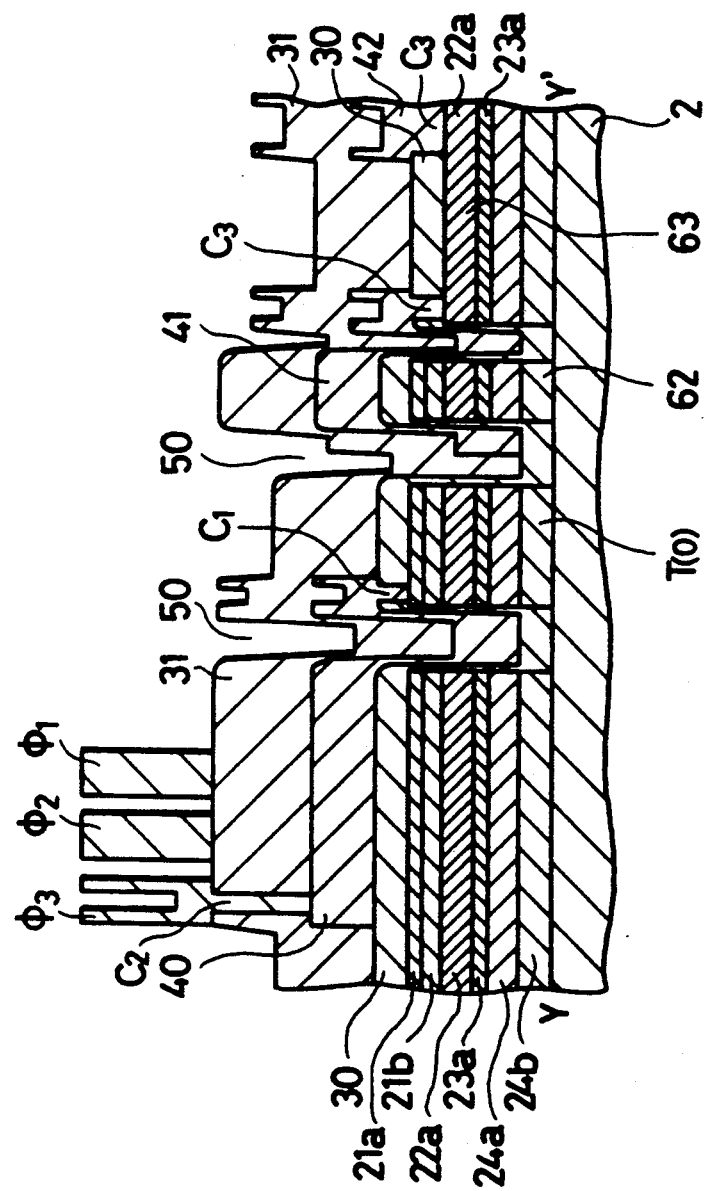

Referring to FIG. 4, a light-emitting element T comprises an n-type GaAs substrate 1 served as a cathode, an n-type GaAs layer 24b, an n-type AlGaAs layer 24a and a p-type GaAs layer 23a stacked on the substrate 1, an n-type GaAs layer 22a on the layer 23a and served as a gate 22, a p-type AlGaAs layer 21b, and a p-type GaAs layer 21a served as an anode. The p-type GaAs layer 23a and the n-type GaAs layer 22a as active layers are sandwiched between the AlGaAs layers 21b and 24a having a large band width in order to trap carriers in the active layers so that light emission efficiency can be improved. An insulating protection film 30 is coated over the light-emitting elements T (T(−1) to T(1)) isolated with two row grooves 50 from a clock area and a resistor area and with column grooves 50 from each other.

The gate 22 is connected via a contact hole $C_1$ formed in the insulating protection film 30 to a metal thin film 41 formed on the insulating protection film 30. Another end of the metal film 41 is connected via a contact hole $C_3$ formed in the insulating protection film 30 to the resistor area of the n-type GaAs layer 22a stacked on the n-type GaAs substrate 1 and isolated from the light-emitting element shown in FIG. 5. The contact hole $C_3$ therefore provides a common end of coupling resistors Ri provided on the resistor area.

The anode of each light-emitting element T is connected to every third transfer clock lines $phi_1$, $phi_2$ and $phi_3$ on the clock area via the contact hole $C_1$ formed in the insulating film 30, the metal thin film 40 formed on the film 30, and a contact hole $C_2$ formed on an insulating film 31.

The metal film 41 is also connected to a bias voltage $V_{GK}$ via the contact hole $C_1$, the contact hole $C_3$ formed and the resistor area of the n-type GaAs layer 22a stacked on the n-type GaAs substrate 1 and isolated from the light-emitting element T. The contact hole $C_3$ therefore provides an end of pull-up resistor $R_L$ provided on the resistor area.

An operation of the light-emitting device will be described below. If the transfer clock $phi_3$ goes HIGH to turn on the light-emitting element T(0), the gate $G_0$ of the light-emitting element T(0) is at substantially 0 V. Therefore, current flows through a resistor network connecting the gates of the light-emitting elements T. For this reason, the voltage of the gate close to the light-emitting element T(0) is reduced most, and an influence becomes smaller as a position is separated. For example, when the next transfer clock $phi_1$ goes HIGH, every third light-emitting elements T(1) and T(−2) are enabled. However, the voltage of the gate $G_1$ is lower than that of the gate $G_{−2}$. For this reason, only the light-emitting element T(1) is enabled by setting the bias voltage to be higher than the operation voltage of the light-emitting element T(1) and lower than the operation voltage of the light-emitting element T(−2). By repeatedly performing this operation, the light-emitting elements T can be scanned by using the three transfer clock lines.

As described above, according to the light-emitting device of the prior art, the turn-on voltage or current of one light-emitting element is influenced or changed by the former ON state of the adjacent light-emitting element, thereby realizing a light emission self-scanning function.

Figure 7:
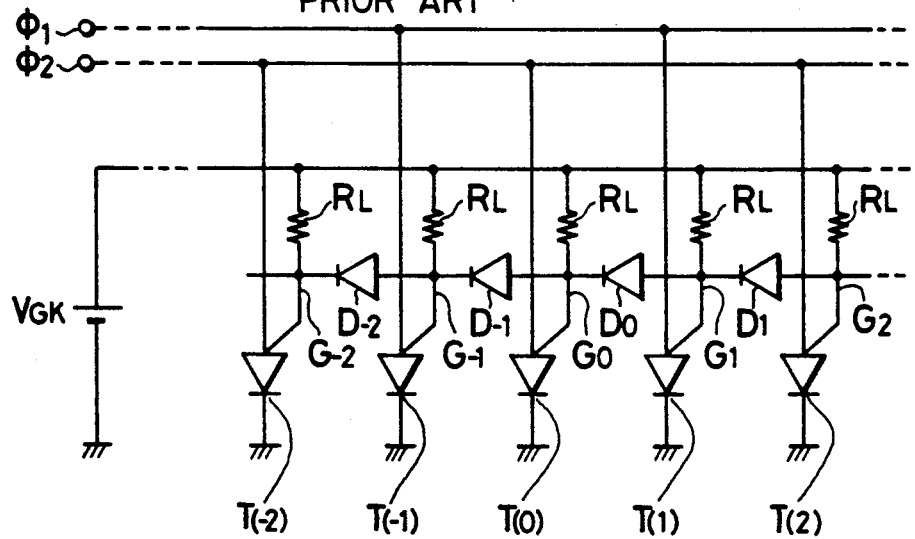
FIG. 7 is an equivalent circuit diagram showing a light-emitting array using a diode coupling system.

FIG. 7 is an equivalent circuit diagram showing another light-emitting array which shows a feature for electrically connecting light-emitting elements or thyristors T(n), where n is an integer including zero, by using diodes. Referring to FIG. 7, reference symbols Gn denote the gates of the light-emitting elements T(n); $R_L$, the pull-up resistor connected to the gate; and Dn, coupling diodes for performing an electrical interaction. Reference symbol $V_{GK}$ denotes the bias voltage of a DC power source. Two transfer clock lines (transfer clocks $phi_1$ and $phi_2$) are connected to the anodes of every other light-emitting elements T(n), respectively.

An operation of FIG. 7 will be described below. When the transfer clock $phi_2$ goes HIGH to turn on the light-emitting element T(0), the voltage of the gate $G_0$ is reduced close to 0 V. Assuming that the bias voltage $V_{GK}$ is 5 V, the gate $G_1$ voltage of the next light-emitting element T(1) goes LOW to the forward voltage $V_{df}$ due to the diode $D_0$ and the gate $G_2$ voltage of the succeeding light-emitting element T(2) goes LOW to the double forward voltage $2 V_{df}$ due to the diodes $D_0$ and $D_1$. Though the transfer clock $phi_2$ at the high level voltage is also applied to the gates Gn(n>2) of the succeeding light-emitting elements T(2n) which do not turn on since the turn on threshold level thereof is predetermined between the $V_{df}$ and $2 V_{df}$ where n is a positive integer.

Since the coupling diode $D_{-1}$ is reverse-biased, the remaining gate $G_{-1}$, $G_{-2}$, . . . of the light-emitting elements T(−1), T(−2), . . . remain at the same potential as the bias voltage $V_{GK}$. Therefore, remaining light-emitting elements T(−1), T(−2), . . . do not turn on.

When the next transfer clock $phi_1$ is applied to the light-emitting elements T(1), T(−1), . . . , since the gate $G_1$ voltage of the element T(1) has about $V_{df}$, only the light-emitting element T(1) can be turned. As a result, an ON state transfer operation from one element to the next can be performed.

Figure 8:
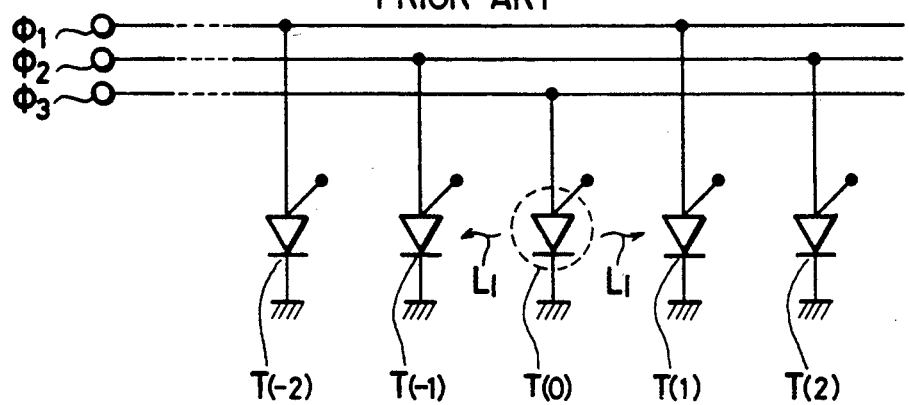
FIG. 8 is an equivalent circuit diagram showing a light-emitting array using an optical means.

FIG. 8 shows another prior art showing a light-emitting array using an optical means. The anodes of light-emitting thyristors T(−2) to T(2), . . . are connected to three transfer clock lines $phi_1$ to $phi_3$ in every third fashion. This light-emitting array is arranged such that a part of emitted light is incident on an adjacent light-emitting element, and utilizes a phenomenon in that an ON voltage of the light-emitting element T on which light is incident is reduced.

When the transfer clock $phi_3$ goes HIGH to turn on the light-emitting element T(0), ON voltages of the light-emitting elements T(−1) and T(1) located at both sides of the light-emitting element T(0) is reduced. Therefore, when a high-level voltage is applied to the next transfer clock $phi_1$, only the light-emitting element T(1) can be turned on. As a result, the light-emitting array shown in FIG. 8 can perform self-scanning.

Generally, in a light-emitting device for use in an optical printer, not only a light emission point having an address must be moved, but also light emission intensity at the light emission point must be modulated. In the above self-scanning light-emitting device, modulation of light emission intensity can be performed by the following driving method.

Figure 6:
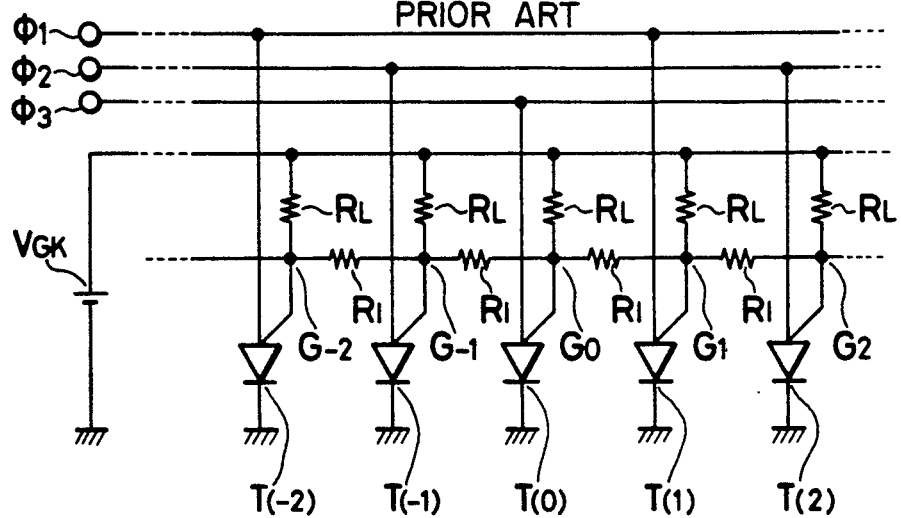
FIG. 6 is an equivalent circuit diagram of FIG. 3.
Figure 9:
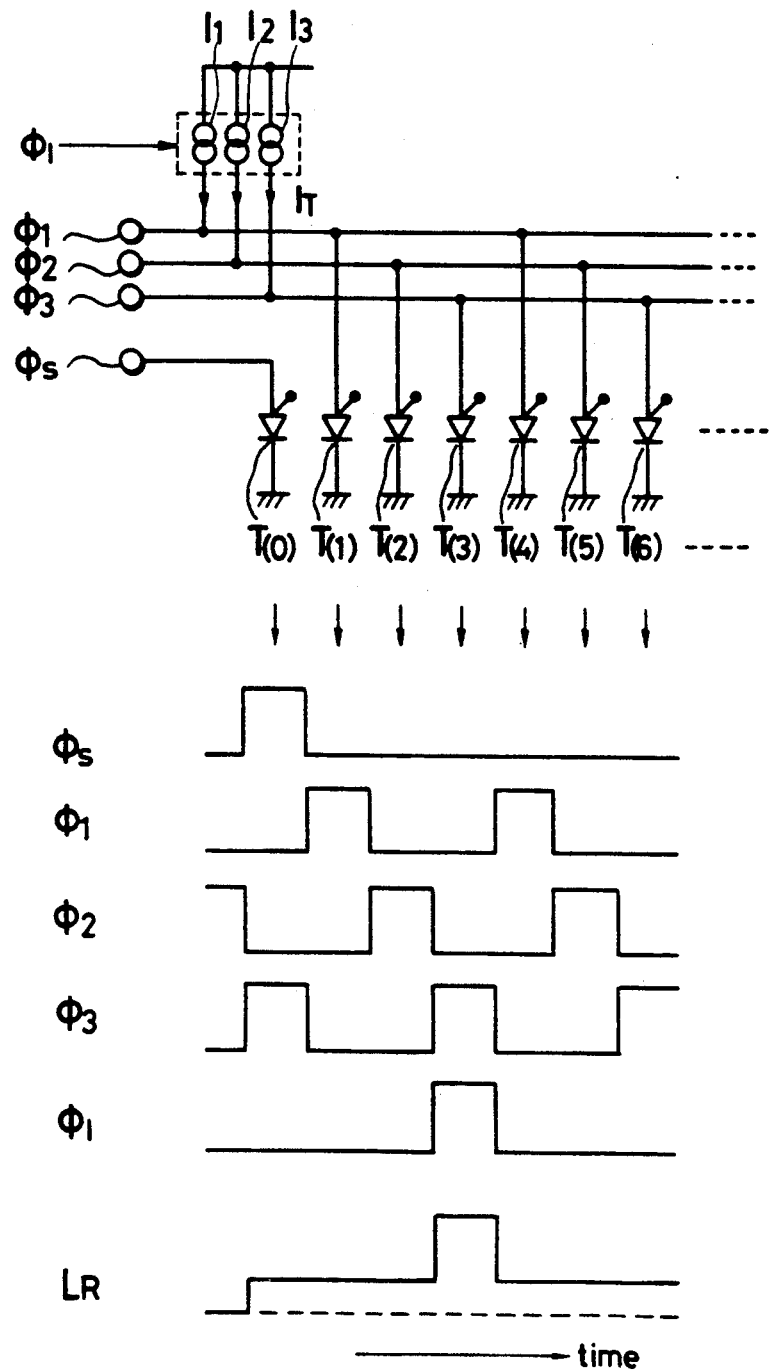
FIG. 9 is a pulse timing chart showing a method of driving a light-emitting array.

FIG. 9 shows the principle of this driving method. The gates of light-emitting elements T(0) to T(6) are connected by the electric means as shown in FIG. 6 or 7 or the optical means as shown in FIG. 8. The transfer clock lines $phi_1$, $phi_2$ and $phi_3$ is connected to the anodes of the light-emitting elements T(1) to T(6) in every third fashion in the longitudinal direction. Current sources $I_1$, $I_2$ and $I_3$ are connected to the transfer clock lines $phi_1$, $phi_2$ and $phi_3$, respectively, so as to make the minimum ON state light emitting element to the maximum ON state thereof under a control of a control signal $phi_I$. A start pulse $phi_S$ is connected to the anode of the light-emitting element T(0).

Substantial three phase rectangular wave signals are applied as transfer pulses to the transfer clock lines $phi_1$, $phi_2$ and $phi_3$ with a delay t1 with respect to a time t and having a short overlap time.

The rectangular start pulse $phi_S$ is applied to the light-emitting element T(0) to, provide a minimum ON state. The transfer clock $phi_1$ is then applied to provide a minimum ON state of the element T(1) before turning off the start pulse $phi_S$. The subsequent transfer clocks $phi_2$, $phi_3$ and $phi_1$ are repeatedly applied to one element T(n) with the short overlap time for the next element T(n+1) where n is a positive integer. As a result, the light-emitting array starts self-scanning. The ON/OFF current is applied to and synchronized with the transfer clocks $phi_1$, $phi_2$ and $phi_3$ under a control of the control signal $phi_I$ via the current sources $I_1$, $I_2$ and $I_3$. In this manner, the light-emitting element set in the minimum light emission state to achieve the self-scanning function can emit the maximum light when modulated by the control signal $phi_I$.

In the above self-scanning light-emitting device, the luminance of an arbitrary portion can be increased by the method as described above to write an image in, e.g., an optical printer.

If the above method is used, however, as is apparent from light emission intensity $L_R$ indicated in a bottom portion of FIG. 9, elements except for the element T(3) for writing an image more or less emit light (to be referred to as bias light hereinafter). This light emission is caused by a current for setting an ON state upon transfer of the ON state. For this reason, when the above device is used in an optical printer, light is radiated to some extent on the entire portion of an image to degrade the quality of the image.

In addition, in the conventional method, current sources must be formed in a number corresponding to the number of phases of transfer clocks, resulting in a complicated and expensive driver portion.

Furthermore, in the above self-scanning light-emitting device, an average light emission intensity is low because a light emission duty cycle is low. Therefore, the life of the device is shortened when intense light emission is performed.

That is, in the above self-scanning light-emitting device, always one element is in an ON state (i.e., a light emission state). For this reason, if a light-emitting device having 1,000 bits is arranged, for example, a light emission time of one bit is only 1/1,000 the entire light emission (i.e., a duty cycle of light emission is 1/1,000). Therefore, in order to obtain the same average light amount as that obtained when the duty cycle is 1, a current of 1,000 times or more must be flowed to each light-emitting element. This shortens the life of each light-emitting element to make it difficult to manufacture a long-life light-emitting device.

Embodiments 1 to 5 of the present invention will be described in detail below.

Embodiment 1

Figure 10:
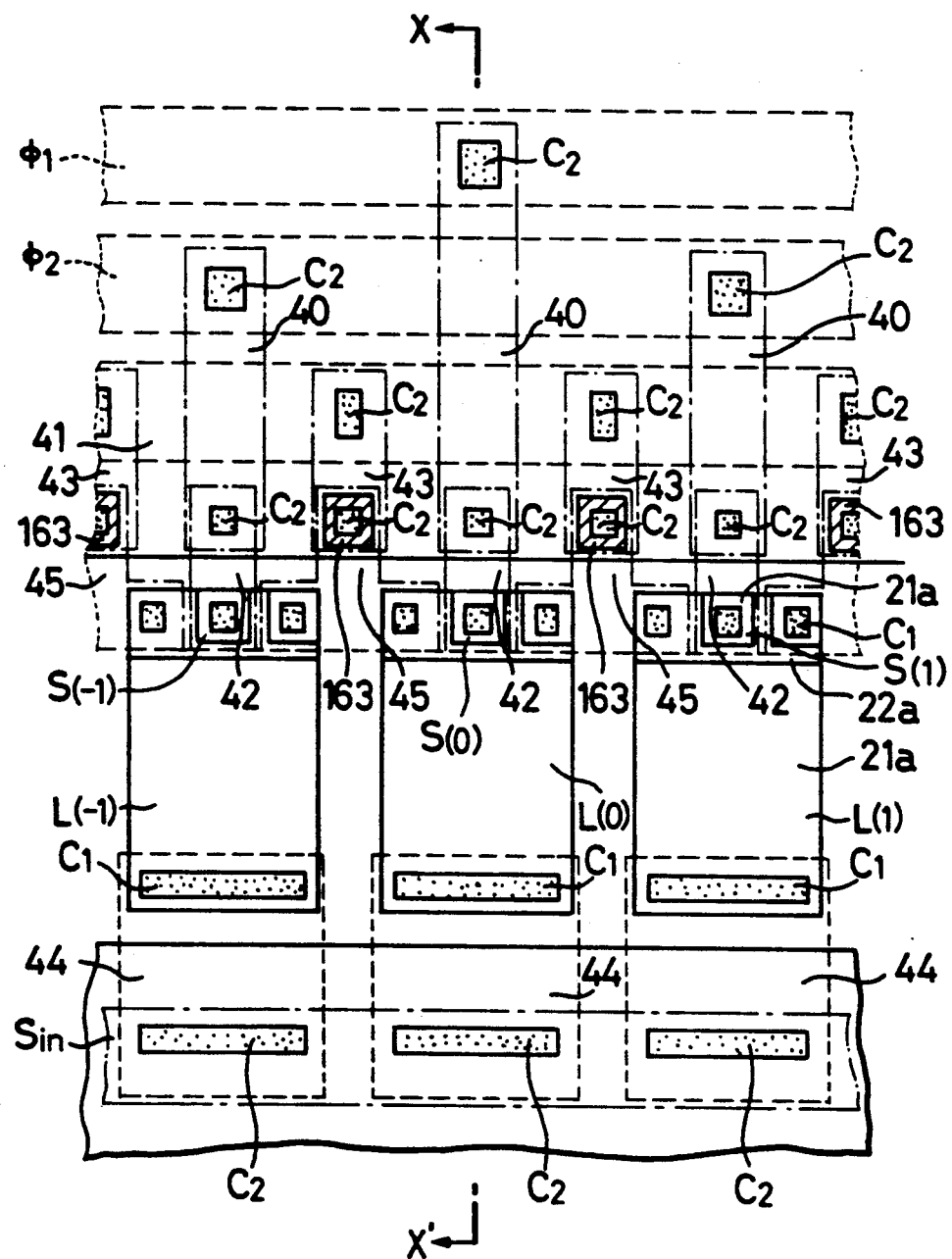
FIG. 10 is a plan view showing the first embodiment of the present invention.
Figure 11:
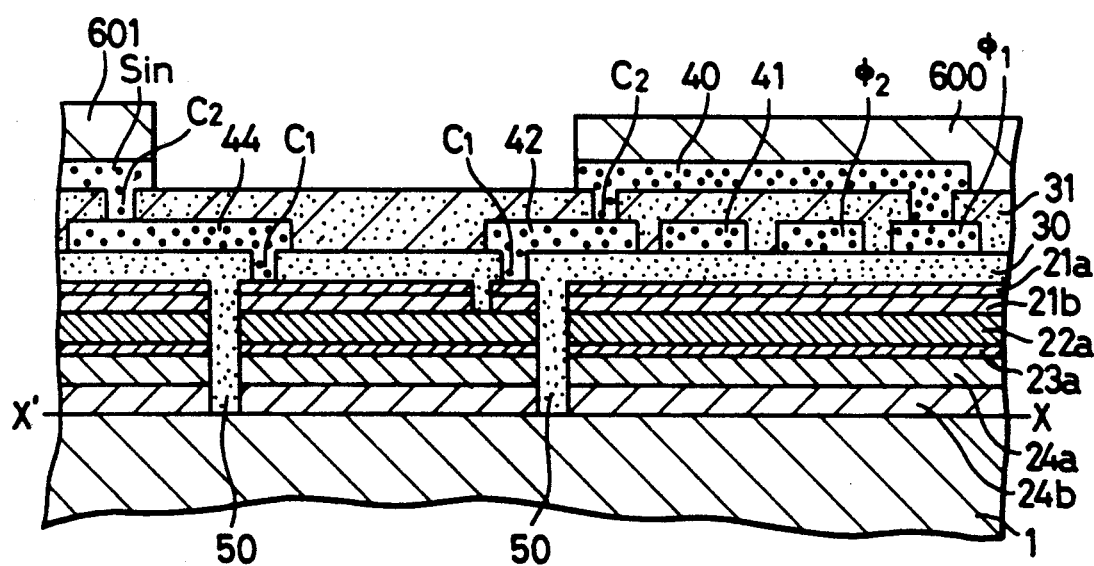
FIG. 11 is a sectional view of FIG. 10.

The first embodiment of the present invention is schematically shown in FIGS. 10 to 13. FIG. 10 is a plan view showing a schematic arrangement of a light-emitting device of the first embodiment, and FIG. 11 is a sectional view thereof taken along a line X—X' in FIG. 10. A layer arrangement of this embodiment is the same as that of the conventional light-emitting array shown in FIGS. 3, 4 and 5. The manufacturing steps and structure of the first embodiment will be described below.

An n-type GaAs layer 24b, an n-type AlGaAs layer 24a, a p-type GaAs layer 23a, an n-type GaAs layer 22a, a p-type AlGaAs layer 21b, and a p-type GaAs layer 21a are sequentially stacked on an n-type GaAs substrate 1.

The stacked semiconductor layers are isolated into a light-emitting area C, a clock and bias area B and a write signal area W by two separating grooves 50 each extending along Y or row direction as shown FIG. 11 and having a depth contacted to the substrate 1. The light-emitting area C is further isolated into a plurality of cells with another grooves each extending along X or column direction and having a depth contacted to the substrate 1. In the cell, the reverse pi groove having a depth contacted to the n-type GaAs layer 22a is provided to form left top, middle top, right top and large bottom areas as shown in FIG. 10. The left top area of the p-type GaAs layer 21a and the P-type AlGaAs layer 21b are removed to provide a common gate of transfer element S and light-emitting element L which are also provided with the middle top and large bottom areas respectively. The right top area provides a P-N junction or coupling diode in combination with the n-type GaAs layer 22a.

An insulating film 30 is coated on the entire substrate.

Connection contact holes $C_1$ are formed in the insulating film 30 at positions on the n-type GaAs layer 22a to provide the common gate and the middle and right tops and bottom portions of the p-type GaAs layer 21a to provide three anodes of the transfer element S and light emitting element and the diode.

Formed on the insulating 30 are metal thin films 45, 44 and 42 per the cell, and a bias line 41 and two clock lines $phi_1$ and $phi_2$ each extending along the Y direction. The T-shaped metal film 45 is connected between the common gate of one pair of elements and the anode of the diode of the next adjacent cell via the contact holes $C_1$. The metal film 44 for transmitting ON/OFF write signal is connected to the large bottom anode of the light-emitting element via the contact hole $C_1$. The metal film 42 for transmitting the transfer clock is connected to the anode of the transfer element via the contact hole $C_1$.

Phosphor-doped amorphous silicon 163 to be used as the pull-up resistor $R_L$ is coated on a top part of the metal film 45 to have a thickness of about 1 μm.

The amorphous silicon 163 is isolated from and in correspondence with the light-emitting element.

A further insulating film or coating 31 is then coated on the entire substrate.

Connection contact holes $C_2$ are formed in the further insulating film 31 at positions on the amorphous silicon 163, the metal film 42, and the metal film 44.

The write signal line $S_{in}$ formed on the insulating film 31 is connected to the metal film 44 via the contact hole $C_2$ for transmitting the write signal or light emission ON/OFF information to the anode of the light-emitting element. The bias line 41 is connected to the metal film 43 via the contact hole $C_2$, for transmitting the bias voltage to the gate of the transfer element via the amorphous silicon 163. The clock lines $phi_1$ and $phi_2$ transmit clock pulses to the metal thin film 40 (the anode of the transfer or scanning element) via the contact holes $C_2$.

The position of one of the contact holes $C_2$ formed on the metal thin film 40 for coupling the clock lines is alternately selected with respect to the clock lines $phi_1$ and $phi_2$ so that the anode of each scanning element is connected to one of the clock lines $phi_1$ and $phi_2$. It is noted that in FIG. 11, reference numerals 600 and 601 denote light-shielding layers for shielding bias light.

In the structure of the above embodiment, since all the transfer elements, the coupling diodes, and the light-emitting elements can be formed by patterning the p-type GaAs layer 21a and the p-type AlGaAs layer 21b, the manufacturing steps are not so much different from conventional light-emitting element manufacturing steps. That is, although the structure is complicated, the manufacturing steps are not complicated.

Figure 12A:
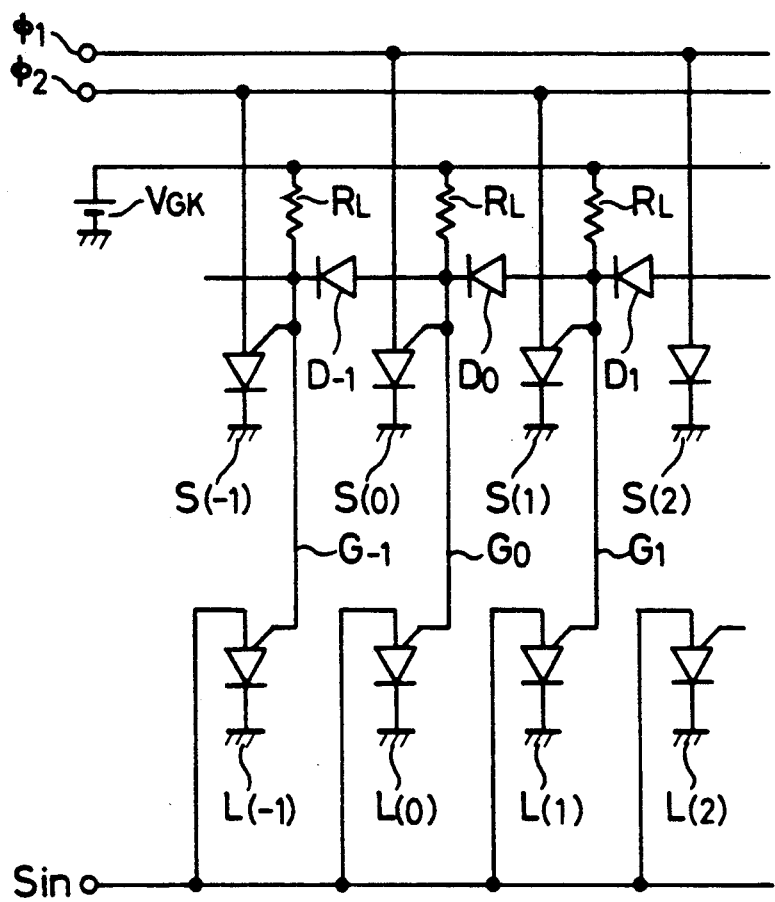
FIG. 12A is an equivalent circuit diagram of FIG. 10.
Figure 12B:
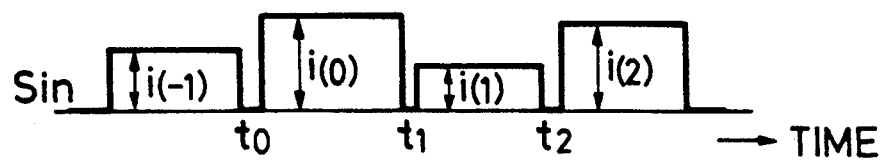
FIG. 12B is a view showing a waveform of a write signal Sin.

FIG. 12A shows an equivalent circuit diagram of this light-emitting device. As is apparent from FIG. 12, the light-emitting device of this embodiment mainly consists of transfer elements $S(-1)$ to $S(2)$ and light-emitting elements $L(-1)$ to $L(2)$. The arrangement of a portion of the transfer elements is exactly the same as the conventional arrangement described above, in which the diode connection shown in FIG. 7 is used. Gates $G_{-1}$ to $G_1$ of the transfer elements S are connected to the gates of the light-emitting elements L. A write signal $S_{in}$ is applied to the anode of each light-emitting element L.

An operation of the above light-emitting device will be described below.

Figure 13:
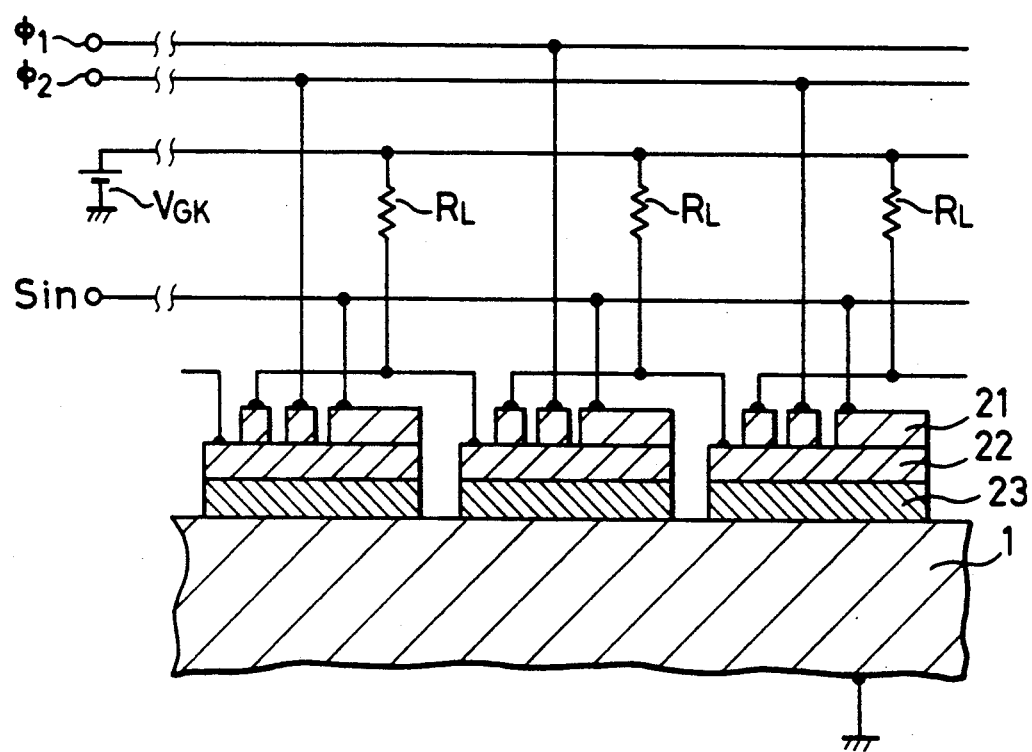
FIG. 13 is a sectional view showing a transfer light-emitting array in the first embodiment

FIG. 13 is a schematic sectional view of a transfer array. A portion of the transfer elements operates similarly to the conventional arrangement, i.e., the transfer elements $S(-1)$, $S(0)$, $S(1)$, $S(2)$, . . . , are sequentially turned on by two-phase clock pulses $phi_1$ and $phi_2$.

Assuming that the transfer element $S(0)$ is in an ON state, the voltage of the gate $G_0$ is reduced below $V_{GK}$ (assumed to be 5 V in this case) to be substantially 0 V. Therefore, if the voltage of the write signal $S_{in}$ higher than a diffusion potential (about 1 V) of a p-n junction, the light-emitting element $L(0)$ can be set in a light emission state. The voltage of the gate $G_{-1}$ is about 5 V, and the voltage of the gate $G_1$ is about 1 V. Therefore, the write voltage of the light-emitting element $L(-1)$ is about 6 V, and the write voltage of the light-emitting element $L(1)$ is about 2 V. As a result, the voltage of the $S_{in}$ write signal Sin which can be written in only the light-emitting element $L(0)$ falls within the range of 1 to 2 V.

When the light-emitting element $L(0)$ is set in the ON state, i.e., the light emission state, the voltage of the write signal line $S_{in}$ is fixed at about 1 V. Therefore, an error in which another light-emitting element is selected can be prevented. Light emission intensity is determined by a current amounts $i(-1), i(0), i(1), \ldots$, to be flowed into the write signal $S_{in}$ shown in FIG. 12B, and an image write operation can be performed with an arbitrary intensity. In order to transfer the light emission state to the next element, the voltage of the write signal $S_{in}$ line must be reduced to 0 V at times $t_0, t_1, t_2, \ldots$, shown in FIG. 12B to temporarily set the light-emitting element L which is emitting light in an OFF state.

In this arrangement, a diode coupling system is used as a coupling system for a control electrode having a threshold voltage or current which can be externally controlled. The coupling system is not limited to the above system but may be the resistor network system as shown in FIG. 6 or the optical coupling system as shown in FIG. 8.

In the above embodiment, amorphous silicon is used as the resistor 163. However, an arbitrary substance can be used as long as the substance has a resistivity similar to that of the resistor 163. In addition, the structure of the resistor is not limited to the above structure. For example, a structure in which a portion of layers stacked to form light-emitting elements is used as a resistance layer can be used.

Embodiment 2

Figure 14:
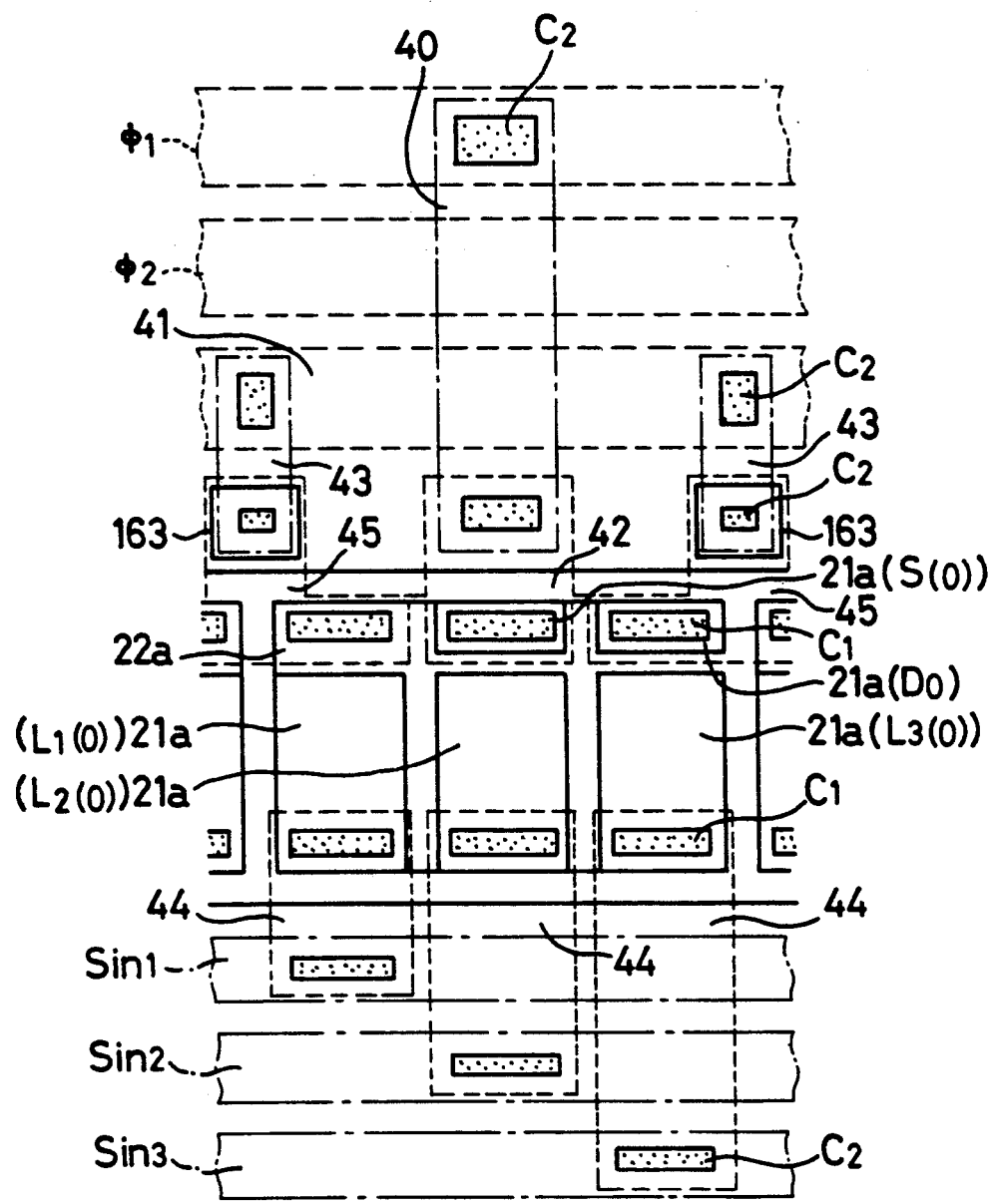
FIG. 14 is a plan view showing the second embodiment of the present invention.

The second embodiment of the present invention will be described below with reference to FIGS. 14 and 15.

An n-type GaAs layer 24b, an n-type AlGaAs layer 24a, a p-type GaAs layer 23a, an n-type GaAs layer 22a, a p-type AlGaAs layer 21b, and a p-type GaAs layer 21a are sequentially stacked on an n-type GaAs substrate 1.

The stacked semiconductor layers are isolated into a plurality of light-emitting cells with two isolation row grooves 50 and a plurality of isolation column grooves each bridging therebetween and each having a depth contacted to the substrate 1. In the cell, the grating groove having a depth contacted to the n-type GaAs layer 22a is provided to form a left top, a middle top, a right top and large left, middle and right bottom areas as shown in FIG. 14. The left top area of the p-type GaAs layer 21a and the P-type AlGaAs layer 21b are removed so as to provide a common gate of a transfer element S provided with the middle top area and three light-emitting elements $L_1$, $L_2$ and $L_3$ which are also aligned with the large bottom areas. The right top area provides P-N junction or diode in combination with the n-type GaAs layer 22a.

An insulating film 30 is coated on the entire substrate.

Connection contact holes $C_1$ are formed in the insulating film 30 at positions on the n-type GaAs layer 22a to provide the common gate and the middle and right tops of the p-type GaAs layer 21a to provide two anodes of the transfer element S and the diode. Three contact holes $C_1$ are also provided in the bottom portions of the p-type GaAs layers 21a to provide three anodes of the light emitting elements $L_1$, $L_2$ and $L_3$.

Applied on the insulating film 30 are metal thin films 45, 44 and 42 per the cell, and a bias line 41 and two clock lines $phi_1$ and $phi_2$ each extending along the row direction. The T-shaped metal film 45 is connected between the common gate of the four elements in one cell and the anode of the diode of the next adjacent cell via the contact holes $C_1$. Three metal films 44 per one cell and each for transmitting the ON/OFF write signal are connected to the large bottom anodes of the light-emitting elements via the contact holes $C_1$ respectively. The metal film 42 for transmitting the transfer clock is connected to the anode of the transfer element via the contact hole $C_1$.

Phosphor-doped amorphous silicon 163 to be used as the pull-up resistor $R_L$ is partially coated on a top part of the metal film 45 to have a thickness of about 1 um. The amorphous silicon 163 is isolated in one-to-one correspondence with the light-emitting element.

A further insulating film 31 is then coated on the entire substrate.

Connection contact holes $C_2$ are formed in the insulating film 31 at positions on the amorphous silicon 163, the metal film 42, and the metal films 44.

Write signal lines ($S_{in1}$, $S_{in2}$ and $S_{in3}$) each for transmitting the write signal to the metal film 44 (the anode of the light-emitting element) via the contact hole $C_2$ are formed on the insulating film 31. The bias line 41 for transmitting the bias voltage $V_{GK}$ to the metal thin film 43 (connected to the gate of the scanning circuit element) via the contact hole $C_2$ (the amorphous silicon 163), and clock lines $phi_1$ and $phi_2$ for transmitting the transfer clock to the metal thin film 40 (the anode of the scanning circuit element) via the contact hole $C_2$ are formed on the insulating film 31.

The positions of the contact holes $C_2$ formed on the write line coupling metal thin film 44 are selected such that the anode of each scanning circuit element is connected one of the write lines $S_{in1}$, $S_{in2}$ and $S_{in3}$ in the order of $S_{in1}$, $S_{in2}$ and $S_{in3}$.

Figure 15:
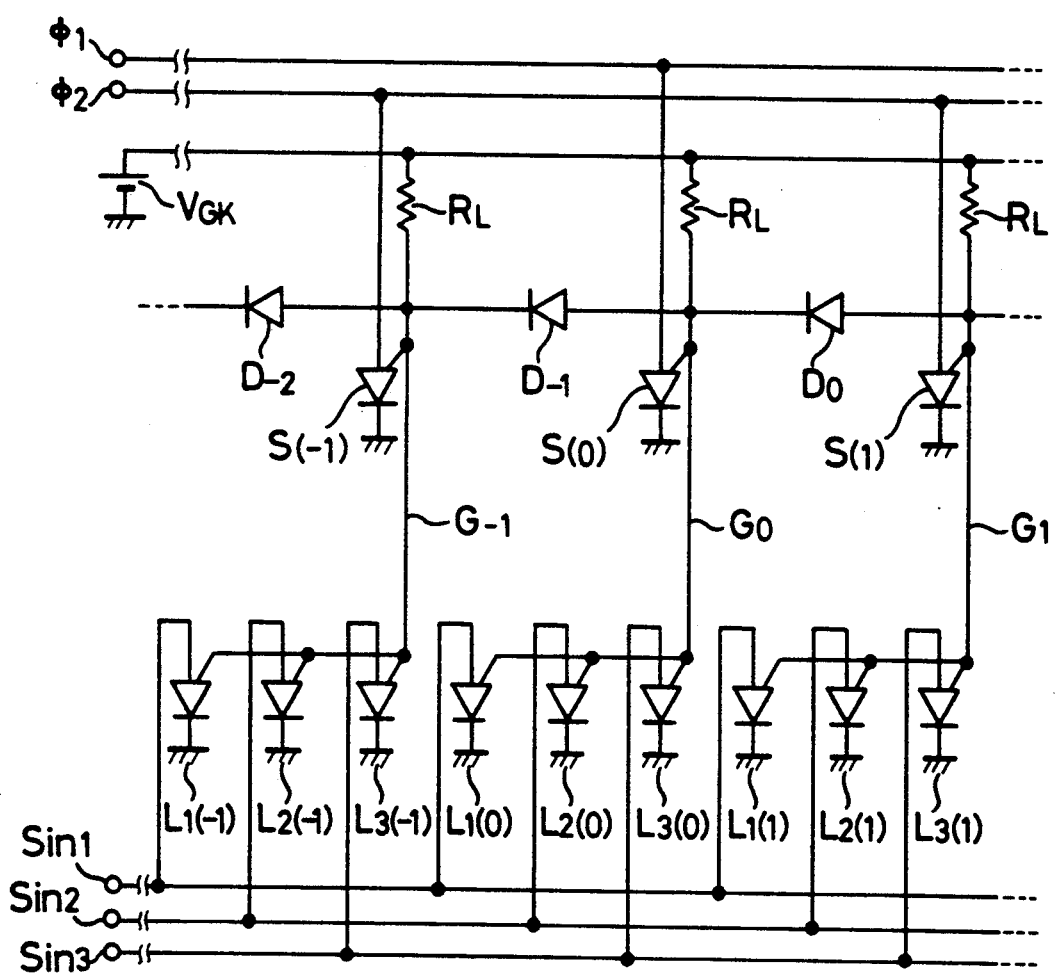
FIG. 15 is an equivalent circuit diagram of FIG. 14.

FIG. 15 is an equivalent circuit diagram of the second embodiment, which is different from that of the first embodiment in that the light-emitting cell is grouped into blocks or three light emitting elements which are controlled by one scanning or transfer element, and the write signal line is independently connected to each light-emitting element in the cell or block to control light emission of the element. The light-emitting elements $L_1(n)$, $L_2(n)$ and $L_3(n)$ then constitute the cell where n is an integer.

An operation of the second embodiment is the same as that of the first embodiment except that light emission for one pixel can be performed in accordance with the write signal $S_{in}$ in the first embodiment while light emission for three pixels can be simultaneously performed with the three elements per one transfer clock in the second embodiment.

Assuming that the above self-scanning light-emitting device is used as light source for a generally known optical printer such as an LED printer, in order to print a material corresponding to a short side (=about 21 cm) of an A-4 sheet with a resolution of 16 dots/mm, about 3,400 bits of light-emitting elements are required.

In the light-emitting device according to the first embodiment, about 3,400 light-emitting cells are required because one element can always emit light, while in the second embodiment, about 1,133 light-emitting cells are required and an image is written on by changing the intensity of light emission. In general, when a current amount is increased, a life of a light-emitting element is acceleratedly shortened. Therefore, although a duty cycle of 1/3,400 can be obtained, the life of the light-emitting device of the first embodiment is shorter than that of the conventional LED printer.

According to the second embodiment, however, assuming that the bit total number is the same, a light emission time of one element is three times that of the first embodiment since three elements are included in one block. Therefore, since only a current ⅓ that of the first embodiment need be flowed to a light-emitting element in an ON state, the life of the device can be prolonged as compared with that of the conventional system.

In the above embodiment, three elements are included in one cell or block. However, as the number of elements per cell may be increased, a write current amount can be decreased to prolong the life of the device.

Embodiment 3

A light-emitting device according to the third embodiment of the present invention which can further improve a duty cycle will be described below with reference to FIGS. 16, 17, 18 and 19.

Figure 17:
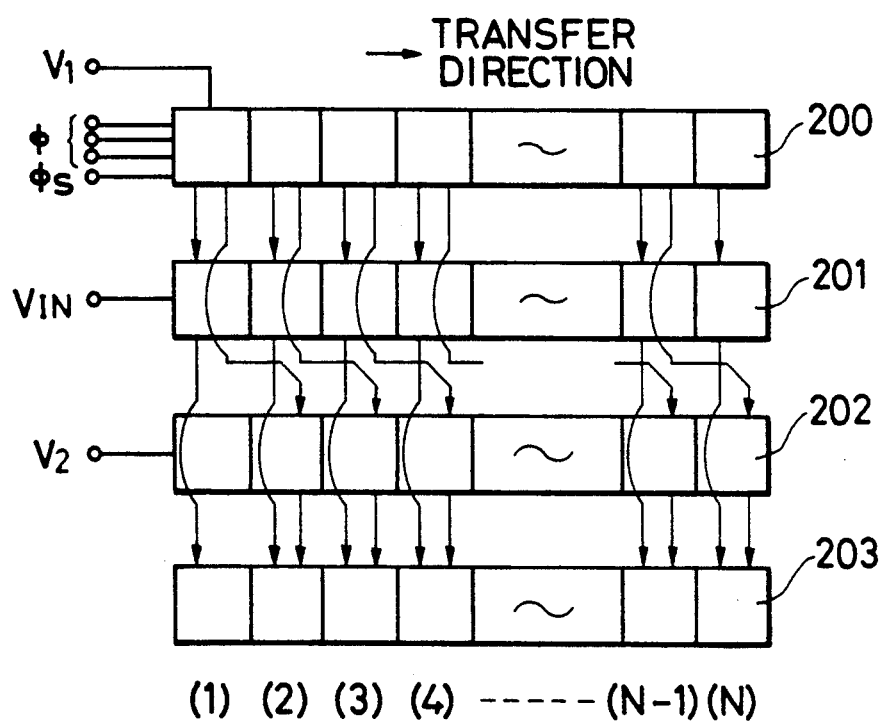
FIG. 17 is a block diagram of FIG. 16.

Referring to FIG. 17, the light-emitting device comprises a shift register array 200, a write switching array 201, a reset switching array 202, and a light-emitting memory array 203. Each array consists of N elements or cells from Nos. (1) to (N).

The shift register array 200 comprises register cells $S(n)$ each of which is driven by a bias voltage $V_1$ via resistor $R_L$ from the bias voltage, one of transfer clocks phi and a start trigger pulse $phi_S$ to transfer (self-scan) an ON state from one cell to the next where n is positive integer. A transfer direction is from left to right, i.e., from (1) to (N).

The write switching array 201 includes switching transistors $Tr_3(n)$ for writing an input image signal $V_{IN}$ into the light-emitting memory array 203 under a control of the shift register array 200. That is, the write switching array 201 writes an image signal $V_{IN}(t)$ in a bit or cell of the light-emitting memory array 203 corresponding to a bit or cell of the shift register 200 in an ON state at a time t.

In this embodiment, this write operation of the image signal $V_{IN}$ is set to be performed in the same number for each bit. The written light emission information is held in the light-emitting memory array 203.

The shift register array 200 is arranged to simultaneously address the reset switching array 202. In this case, a gate or output of one shift register cell is connected to the reset element advanced by one column in a transfer direction such that the gate of the cell $S(n)$ is connected to the reset switch or element $Tr_4(n+1)$ where n is a positive integer. When the reset switch is addressed or selected, the light-emitting memory element is reset. That is, when a certain bit of the shift register is turned on, a light-emitting memory element advanced by one column in the transfer direction is returned to a non-light emission state (OFF state) regardless of whether it is in a light emission state or not.

With this arrangement, a change in image signal along with time is written as a position change in light-emitting memory element, and image information is written in the light-emitting memory element to form an image pattern formed by light emission. when the next image signal is to be written, the image information written by the reset switch is erased, and new image information is written immediately after the erasure.

For this reason, the light-emitting elements are substantially constantly set in an ON state to obtain a duty cycle of substantially 1.

In this arrangement, only one shift register array 200 is provided, and its output is used in both image signal write and reset operations. However, two shift register arrays may be used in the image signal write and reset operations, respectively.

Figure 18:
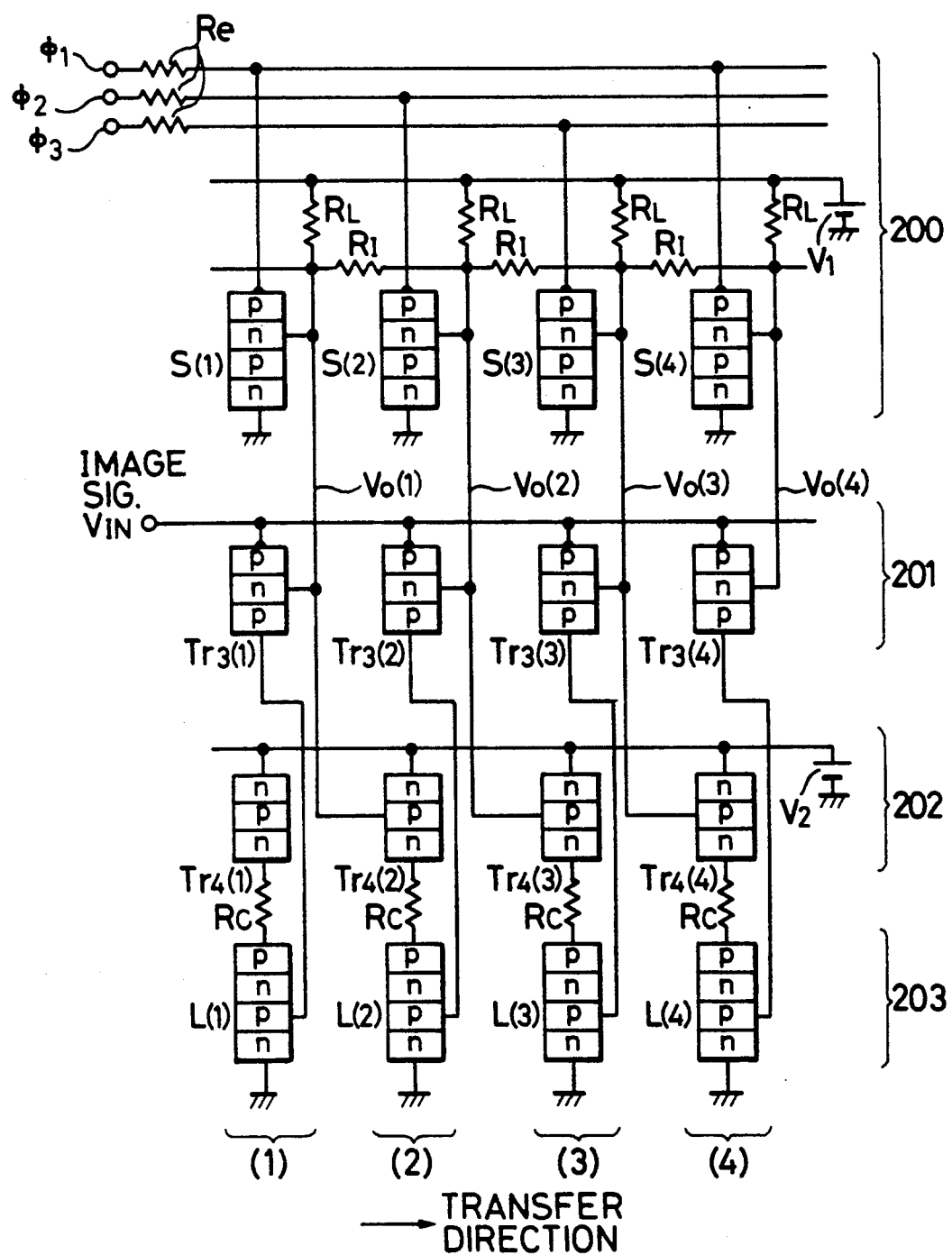
FIG. 18 is an equivalent circuit diagram of FIG. 17.

FIG. 18 is an equivalent circuit diagram of this embodiment corresponding to the arrangement shown in FIG. 17.

The shift register array 200 has the same arrangement as that of the prior art described above. Each thyristors $S(n)$ is constituted by two transistors ($Tr_1$ and $Tr_2$), and its gate is connected to the bias voltage source $V_1$ via pull-up resistor $R_L$ and to the gate of the adjacent thyristor $S(n+1)$ via the resistor $R_I$. Outputs from the shift register $S(n)$ are extracted from the gates and displayed as output voltages $V_0(n)$. In FIG. 18, each resistor Re is a resistor for limiting a current on a clock line.

Pnp transistors $Tr_3(n)$ are used as write switches while npn transistors $Tr_4(n)$ are used as reset switches where n is a positive integer. Each resistor Rc limits the current flowing through the corresponding one of the light-emitting memory elements or thyristors $L(n)$, where n is a positive integer, which is displayed by a combination of two transistors ($Tr_5$ and $Tr_6$). When this light-emitting thyristor is turned on, it is kept ON state until a power source is switched off. This characteristic of the light-emitting thyristor is then used as a light emission memory function.

Figure 20:
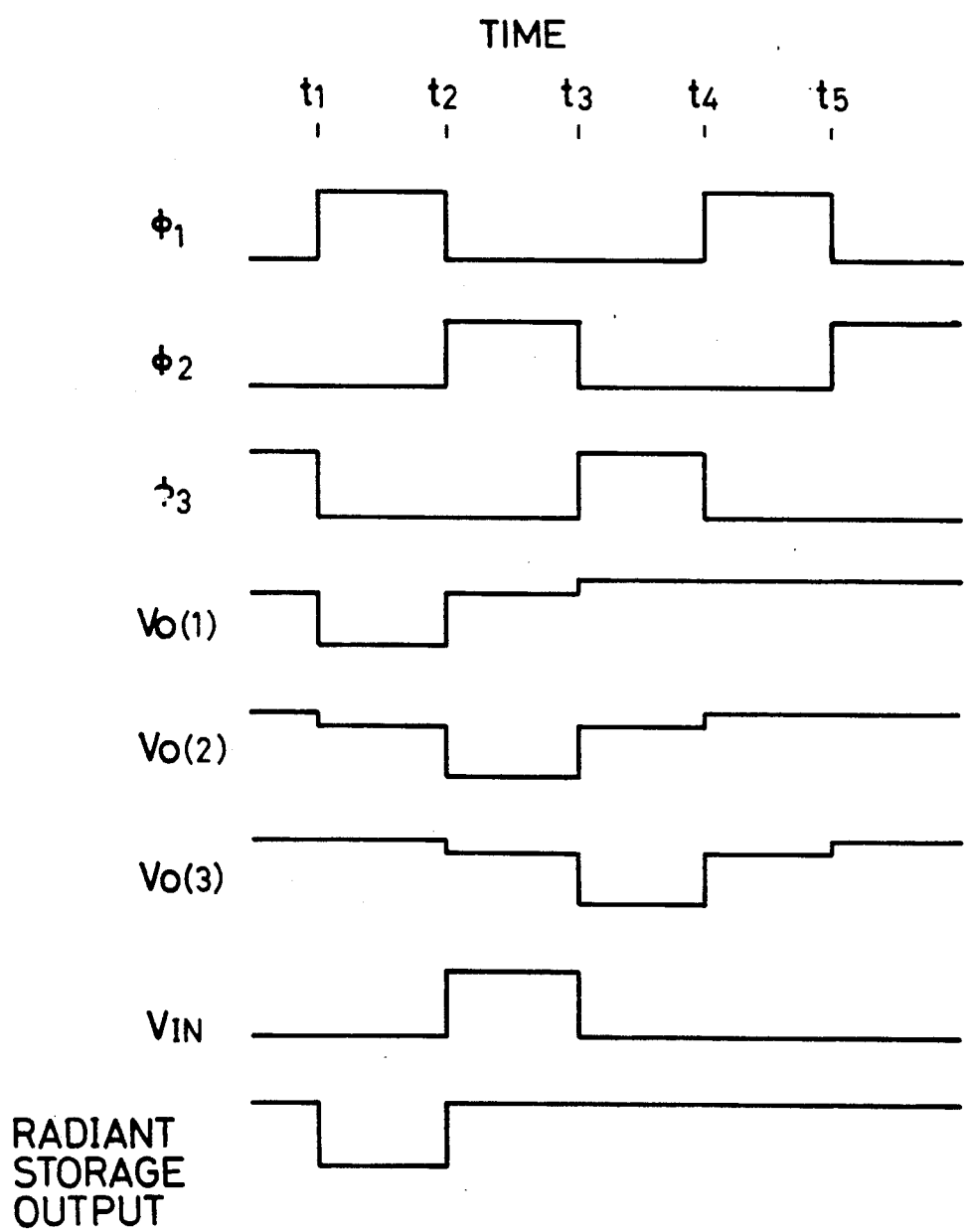
FIG. 20 is a pulse timing chart showing a driving method.

An operation of this equivalent circuit will be described below with reference to a pulse timing chart shown in FIG. 20. Referring to FIG. 20, reference numerals $t_1$ to $t_5$ denote times. Transfer clocks are represented by $phi_1$ to $phi_3$ in which $phi_1$ is at high level from $t_1$ to $t_2$ and $t_4$ to $t_5$, $phi_2$ is at high level from $t_2$ to $t_3$, and $phi_3$ is at high level from $t_3$ to $t_4$. Outputs $V_0(1)$ to $V_0(3)$ from the shift register 200 are extracted in synchronism with $phi_1$ to $phi_3$ and supplied as low-level signals. An image signal $V_{IN}$ is at high level from $t_2$ to $t_3$ and written in a light-emitting element of bit number (2).

A time period between the times $t_1$ and $t_2$ will be described. In this period, the output $V_0(1)$ is extracted as a low-level output from the shift register 200. This output $V_0(1)$ is connected to the base of the transistor $Tr_3(1)$ as a write switch to set the transistor $Tr_3(1)$ in a write enable state. In this case, however, since the image signal $V_{IN}$ is at low level, no write operation is performed for the light-emitting memory element L. The Output $V_0(1)$ is simultaneously applied to the base of the transistor $Tr_4(2)$ as a reset switch and reduced to be about 0 V. For this reason, an emitter voltage of the transistor $Tr_4$ is reduced to be about 0 V to turn off the light-emitting element. Therefore, the light-emitting memory element of bit No. (2) is reset.

A time period between the times $t_2$ and $t_3$ will be taken into consideration. In this period, the shift register output is $V_0(2)$, and this output is applied to the base of the transistor $Tr_3(2)$. Since the image signal $V_{IN}$ is at high level, a current is flowed into the light-emitting memory element through the transistor $Tr_3(2)$. This current serves as a base current of the transistor $Tr_6(2)$ to turn on the light-emitting memory element L(2) of bit No. (2). This light emission is maintained until the next reset signal is input. At this time, the light-emitting memory element L(3) of bit No.(3) is reset by $V_0(2)$.

A current to be flowed into the light-emitting memory element L is limited by the resistor Rc. Since a duty cycle is increased, only a small amount of light emission current need be flowed to realize a highly reliable light-emitting device.

In this embodiment, an operation corresponding to three phases of transfer clocks has been described. However, the device of this embodiment can operate by using four or more phases of transfer clocks.

Although the light-emitting elements are arranged in a line in the above embodiment, they need not be linearly arranged but can be arranged in a zig-zag manner, or the number of lines may be increased to two from the middle of the arrangement.

In this embodiment, the description is limited to a light-emitting thyristor. However, any device can be used as long as it has a similar function. e.g., a laser thyristor may be used as a light-emitting element.

In this embodiment, the light-emitting element may be constituted by a single part or may be integrated by a certain method.

Figure 16:
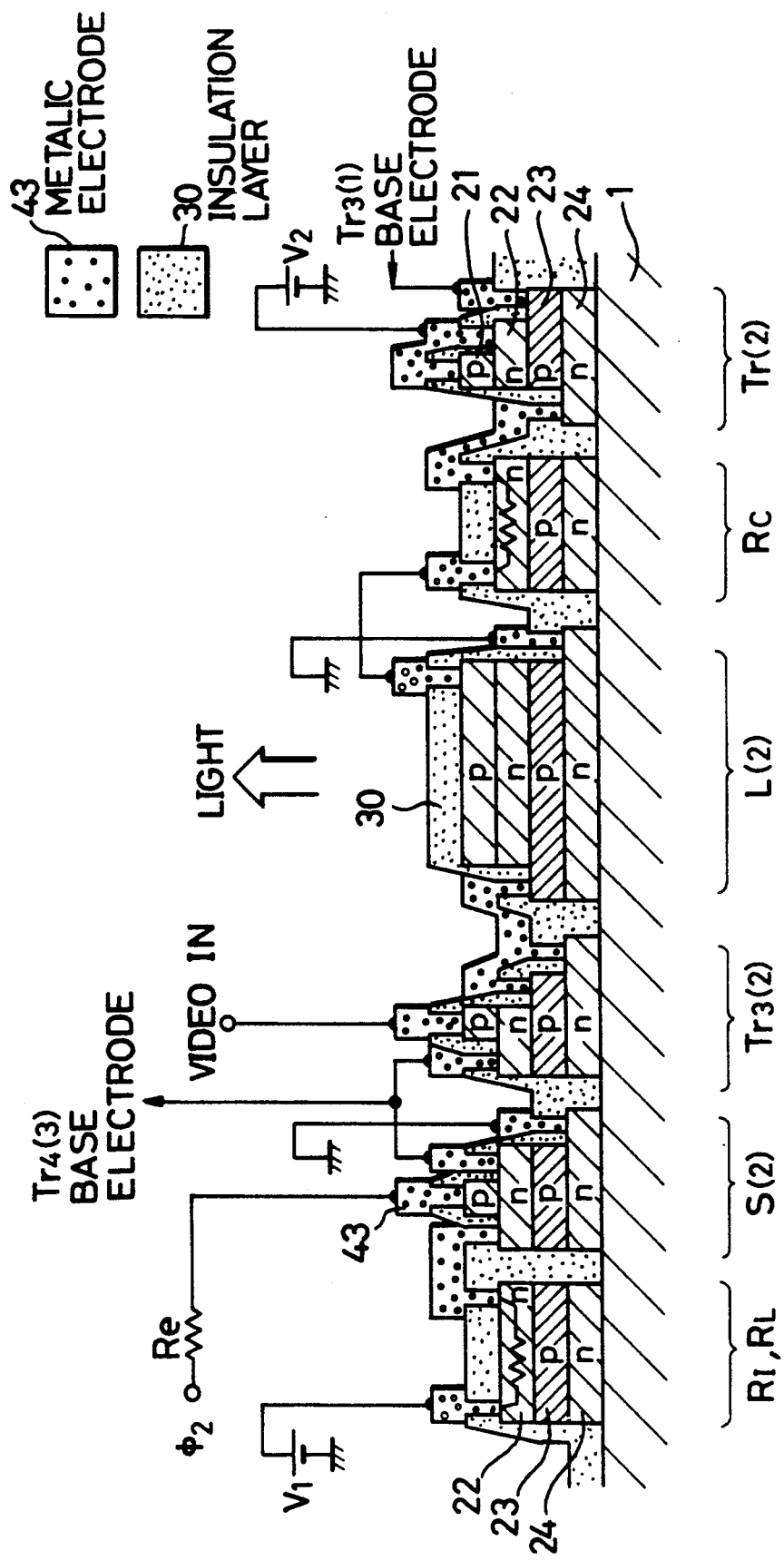
FIG. 16 is a sectional view showing the third embodiment of the present invention.
Figure 19:
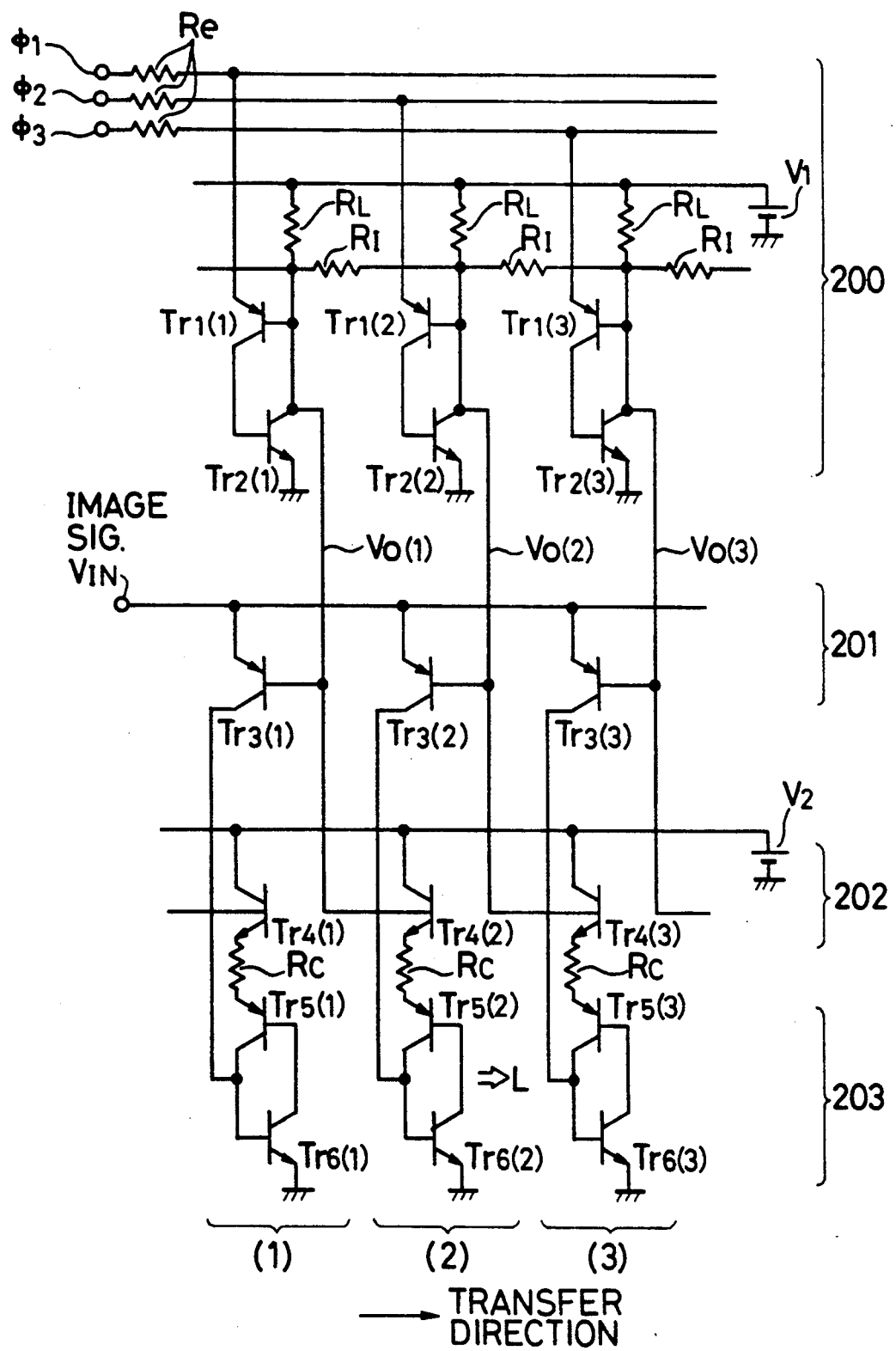
FIG. 19 is a circuit showing a p-n image view of the equivalent circuit diagram shown in FIG. 17.

FIG. 16 shows an arrangement in which the equivalent circuit shown in FIG. 18 is integrated. FIG. 19 is a view showing the equivalent circuit shown in FIG. 18 rewritten by a p-n image. Each bit or cell of the shift register array 200 is represented by a pnpn 4-layer arrangement as well as the light-emitting memory element L. The bits having the pnpn arrangement of the shift register 200 are represented by S(1) to S(4), and the bits of the light-emitting memory element are represented by L(1) to L(4). FIG. 16 shows a structure in which this arrangement is formed on a semiconductor substrate.

FIG. 16 is a sectional view showing the structure of bit No. 2). In this structure, an n-type GaAs layer 24, a p-type GaAs layer 23, an n-type GaAs layer 22, and a p-type GaAs layer 21 are sequentially stacked on a semi-insulating GaAs substrate 1. These semiconductor layers are isolated by an insulating film 30 into elements each having a specific function and electrically connected by a metal electrode 43. Resistors $R_L$ and $R_I$ are resistive elements formed by the n-type GaAs layer 22 and having an end connected to the bias voltage source $V_1$. S(2) of the shift register is constituted by the four layers 21, 22, 23 and 24. Tr$_3$(2) of the write switch is constituted by the layers 21, 22 and 23, and the layer 24 which is unnecessary is connected to the layer 23 to cancel an effect of the layer 24.

L(2) of the light-emitting memory element is constituted by the four layers 21, 22, 23 and 24. The layers 23 and 24 of the write switch Tr$_3$(2) are connected to the layer of the shift register L(2) to serve as a write electrode of the light-emitting memory element L. Similar to the resistors $R_I$ and $R_L$, the resistor Rc is formed of the n-type GaAs layer 22. Tr$_4$(2) of the reset switch is constituted by the three layers 22, 23 and 24, and the layer 21 which is unnecessary is connected to the layer 22. The layer 23 is connected to the base (layer 21) of the write switch Tr$_3$(1).

By using the structure shown in FIG. 16, the function described above can be perfectly achieved.

It is noted that GaAs is used as a semiconductor in the first to third embodiments described above, but another semiconductor can be used.

In this embodiment, the structure of the light-emitting memory element is not limited to the pnpn structure. For example, a structure having six or more layers can be used to achieve the same effect. In addition, a thyristor called a static induction (SI) thyristor or a field-controlled thyristor (FCT) can be used to realize the same light-emitting memory function.

As described above, according to the third embodiment, the "transfer element" for performing ON state transfer is isolated from the "storage light-emitting element" for performing an image storage operation. Therefore, the bias light from the transfer element during the image write operation can be prevented by a light-shielding layer applied thereon. As a result, almost no influence of the bias light is produced to improve the quality of a printer or the like.

In addition, since an image write signal can be input directly to a storage light-emitting element without the transfer clock line, an arrangement of the driver can be simplified.

Furthermore, since light-emitting elements are grouped into blocks and a write operation is independently performed for each element in the block, a current amount during the write operation can be reduced to prolong the life of the light-emitting element.

A light-emitting device having a duty cycle of substantially 1 can be manufactured by simple manufacturing steps by using a light-emitting memory array. Therefore, various problems of the number of wire bondings, a drive IC, and the difficulties in realization of compactness and a small pitch can be solved.

The above first to third embodiments can be applied to a write head of an optical printer, a display and the like to improve performance and reduce cost of such equipment.

Embodiment 4

Figure 21:
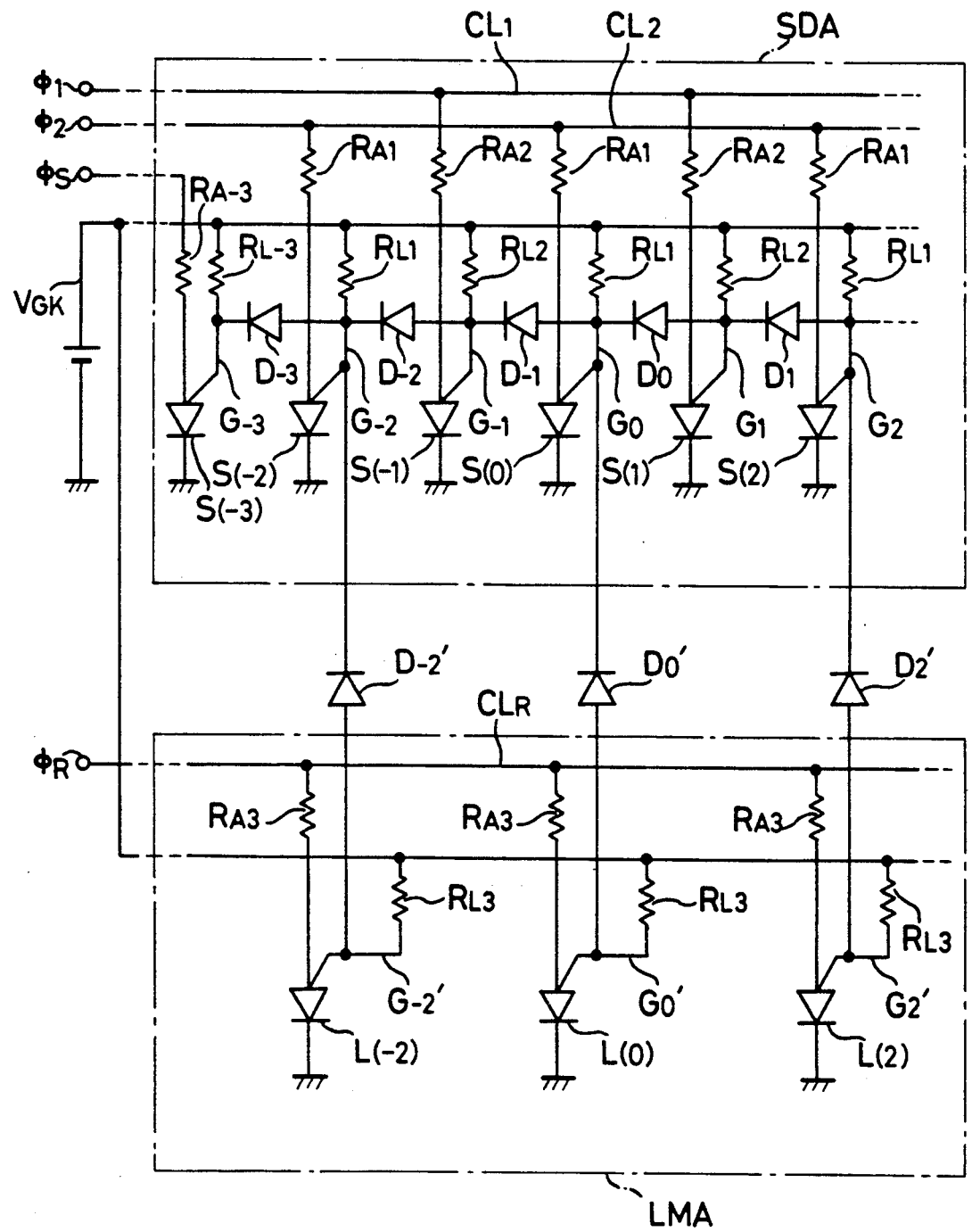
FIG. 21 is an equivalent circuit diagram showing the fourth embodiment of a light-emitting device of the present invention.
Figure 22:
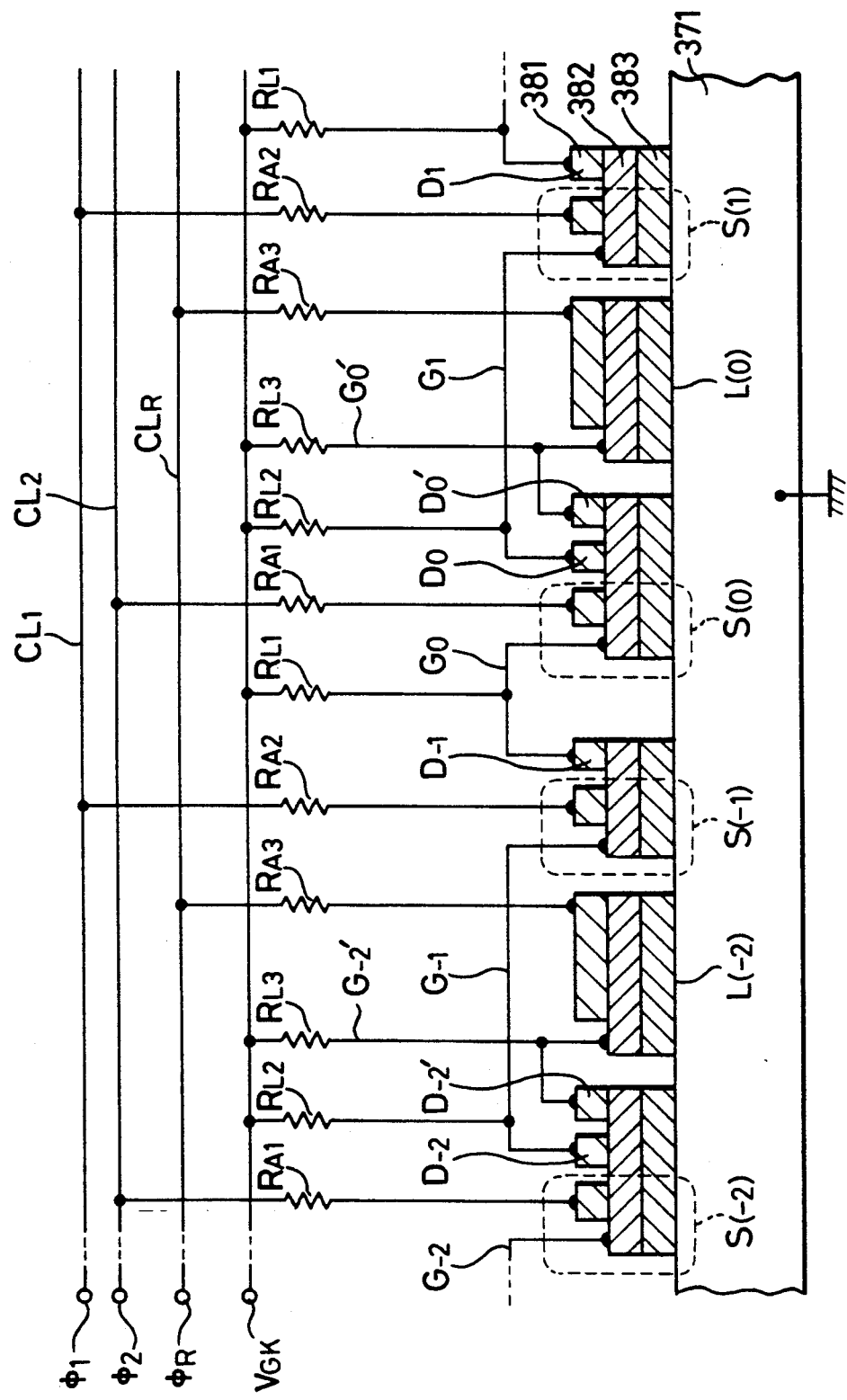
FIG. 22 is a sectional view showing an arrangement in which the equivalent circuit diagram shown in FIG. 21 is formed on a single semiconductor substrate.
Figure 23:
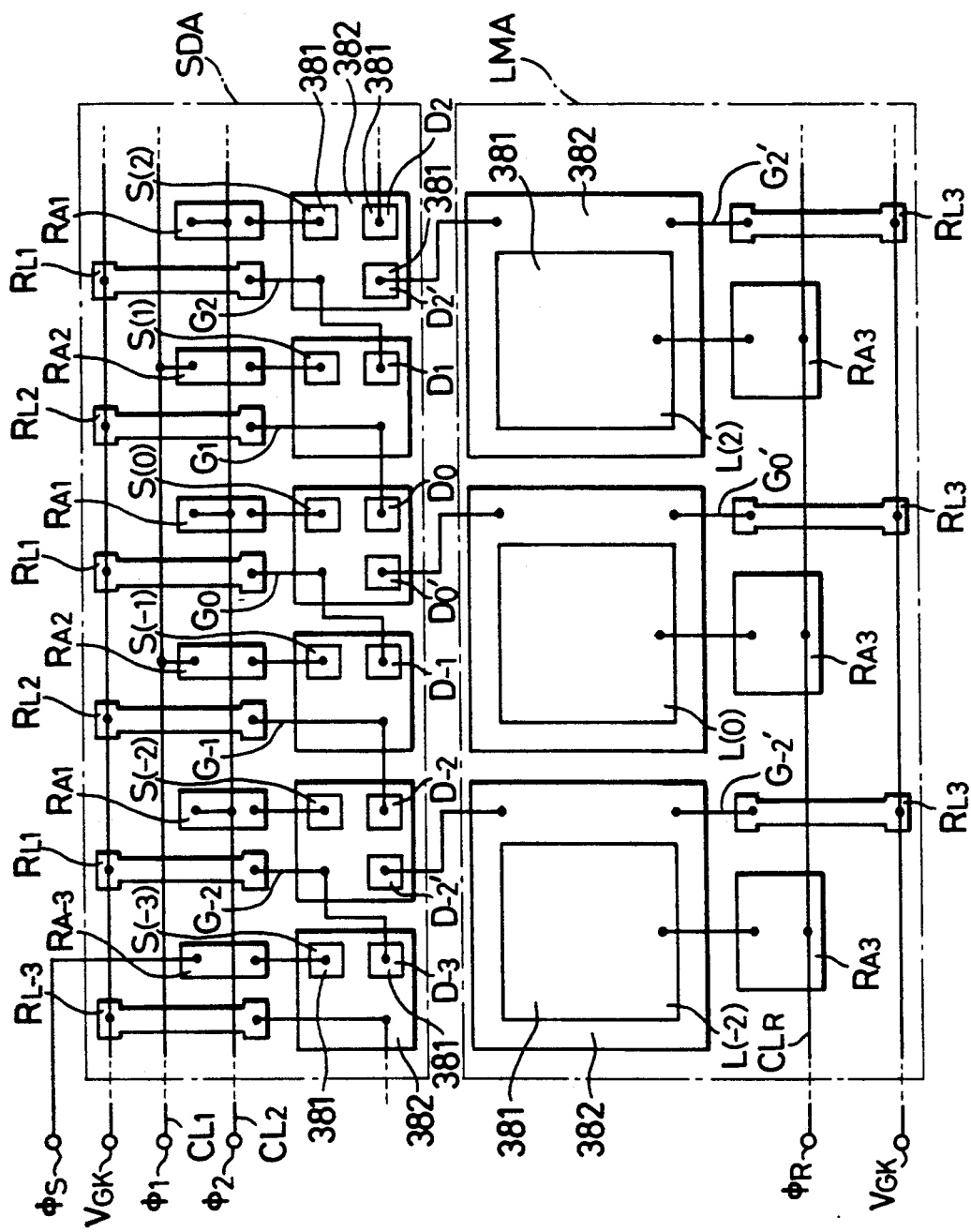
FIG. 23 is a plan view showing an arrangement of the structure shown in FIG. 22.

FIG. 21 is an equivalent circuit diagram of FIGS. 22 and 23 showing the fourth embodiment of a light-emitting device according to the present invention. Referring to FIG. 21, a transfer array SDA and a light-emitting array LMA are separately illustrated in upper and lower portions.

The transfer array SDA having a shift register function comprises transfer elements or thyristors S(2n) and S(2n+1) where n is an integer including zero. The transfer clock phi$_1$ is supplied to the anode of the odd transfer element S(2n+1) via a clock line CL$_1$ and current limiting resistor R$_{A2}$ while the transfer clock phi$_2$ is supplied to the anode of the even transfer element S(2n) via a clock line CL$_2$ and current limiting resistor R$_{A1}$. The cathode and anode of the coupling diode D2n is connected to the gates of the elements S(2n) and S(2n+1) respectively while the cathode and anode of the coupling diode D2n+1 is connected to the gates of the elements S(2n+1) and S(2n) respectively.

Since the above diode coupling system is adopted, the transfer array SDA can perform information transfer operation by using the two-phase transfer clocks phi$_1$ and phi$_2$.

The cathodes of the transfer elements are grounded.

Pull-up resistors $R_{L1}$ and $R_{L2}$ are connected between the gates G2n and G2n+1 of the transfer elements S and a bias line of the bias voltage $V_{GK}$. The gate G$_2$n is connected to the cathode of the diode D$_2$n' (third electric means).

In the transfer array SDA shown in FIG. 21, a transfer element S(−3) is formed at the left side of the even transfer element S(−2) or S(2n). A gate G$_{−3}$ of the transfer element S(−3) is connected to the gate G$_{−2}$ of the transfer element S(−2) by a coupling diode D$_{−3}$ similar to the coupling diode D$_{−2}$. The gate G$_{−3}$ of the transfer element S(−3) is connected to the DC power source of the bias voltage V$_{GK}$ via a pull-up resistor R$_{L−3}$.

The anode of the transfer element S(−3) is connected to a terminal for receiving a start pulse phi$_S$ via an anode load resistor R$_{A−3}$. The cathode of the transfer element S(−3) is grounded. It is noted that although a current source for modulating a light emission intensity is provided for the terminal or line for receiving the start pulse phi$_S$, this current source is not shown in FIG. 21.

The light-emitting array LMA comprises a plurality of light-emitting elements or thyristors L(2n) to which light emitting pulse phi$_R$ is supplied via a current supply line CLR and a current limiting resistor R$_{A3}$ to the anode thereof. The phi$_R$ therefore denotes a clock (scanning signal) for controlling permission/inhibition of an information write operation into the light-emitting elements or thyristors L(2n) and resetting a written state.

The cathodes of the light-emitting elements L(−2), L(0) and L (2) are grounded.

A pull-up resistor RL$_3$ is connected between the gate G2n′ of the light-emitting element L(2n) and the DC power source of the bias voltage V$_{GK}$. The gate G2n′ is connected to the anode of the diode D$_2$n′ (third electric means).

In FIG. 21, the gates G2n of the transfer elements S(−2), S(0) and S(2) or S(2n) are connected to the gates G$_{-2}$′, G$_0$′ and G$_2$′ or G2n′ of the light-emitting elements L(−2), L(0) and L(2) or L(2n) via the diodes D$_{-2}$′, D$_0$′ and D$_2$′, or D2n′ where n is an integer including zero.

An operation of the transfer array SDA will be described below.

Assuming that a high- or low-level voltage is supplied as the start pulse phi$_S$ to the transfer element S(−3) if the high-level voltage is higher than a voltage sum of the bias voltage V$_{GK}$ and a diffusion voltage V$_{dif}$, the transfer element S(−3) is turned on. If a low-level voltage of the start pulse phi$_S$ to be supplied next is lower than the ON state maintaining voltage of the transfer element S(−3), the transfer element S(−3) is turned off.

The gate voltage of the transfer element S(−3) is substantially 0 V in the ON state and is the same as the bias voltage V$_{GK}$ in the OFF state. When the gate voltage of the transfer element S(−3) is substantially 0 V, the gate voltage of the transfer element S(−2) or S(2n) is reduced below the turn-on voltage of the transfer element S(−2) by a coupling diode D$_{-3}$. Therefore, the transfer element S(−2) can be turned on by the transfer clock phi$_2$.

This ON state is sequentially transferred to the right in FIG. 21 by the transfer clocks phi$_1$ and phi$_2$. That is, the ON state is written in the transfer array SDA by the high-level voltage of the start pulse phi$_S$, and this state is sequentially transferred to the right.

If all the bits to be transferred are in an ON state, however, the ON states must be interleaved with OFF idle states as carriers. Also, the OFF state to be transferred is interleaved with the OFF idle states. Therefore, ON and OFF states are repeatedly transferred every other bits. That is, high- and low-level waveforms of the start pulse phi$_S$ must be alternately supplied in synchronism with the transfer clocks phi$_1$ and phi$_2$. Two transfer elements per one light emitting element are also required.

Assuming that effective information is present in an ON and OFF states of only even-number bits and the ON and OFF states are 1 and 0, respectively, 1 or 0 is written by the start pulse phi$_S$, and 1 and 0 are transferred by the transfer clocks phi$_2$. In this manner, a signal (information) of 1 or 0 is written in the transfer array SDA.

An operation of the light-emitting element L(−2), (L(0) and (L(2)) will be described below.

Assuming that the light-emitting element L(−2) is 0, the light-emitting element L(−2) is not turned on if the voltage of the clock phi$_R$ is 0 V. That is, the light-emitting element L(−2) is set in a write inhibition state. If the voltage of the clock phi$_R$ is set between the ON state maintaining voltage of the light-emitting element L(−2) and a voltage of V$_{GK}$+V$_{dif}$, the light-emitting element L(−2) is set in a write enable state. When the voltage of the gate G$_{-2}$ is changed, the light-emitting element L(−2) can be set in an ON state.

An information write operation from the transfer array SDA to the light-emitting array LMA will be described below.

As described above, information of 1 or 0 is written in the transfer array SDA. After the information is written in the last bit, the transfer clocks phi$_1$ and phi$_2$ are set in low- and high-level states. In this manner, the information transfer operation is finished, and the information written in the transfer array SDA is held (especially in even-number bits).

In each even-number bit of the transfer array, the gate voltage of the transfer element S in an ON state is substantially 0 V while the gate voltage of the transfer element S in an OFF state is about twice the voltage V$_{dif}$. It is noted that the gate voltage of the transfer element S in an OFF state is about twice the voltage V$_{dif}$ when a closest even-number bit located in a direction opposite to the transfer direction is in an ON state and is higher than the voltage about twice the voltage V$_{dif}$ if otherwise. The voltage V$_{dif}$ is a diffusion potential of the p-n junction.

The gate voltages of the transfer elements S(2n) are transmitted to the gates G2n′ of the light-emitting elements L(2n) by the diodes D2n′. Therefore, the gate voltage of each of the light-emitting elements L(2n) is the voltage V$_{dif}$ in an ON state and is three times or more the voltage V$_{dif}$ in an OFF state. The turn-on voltage of the light-emitting element is twice the voltage V$_{dif}$ in an ON state and is four times the voltage V$_{dif}$ is an OFF state.

The clock phi$_R$ is temporarily set at 0 V to eliminate the entire light emission (i.e., reset the device) and is increased up to a high-level voltage V$_{HR}$ thereafter. If the voltage V$_{HR}$ is set within the range of:

$$2V_{dif} < V_{HR} < 4V_{dif}$$

a light-emitting element L corresponding to a transfer element S in an ON state is turned on, and a light-emitting element L corresponding to a transfer element S in an OFF state is kept off.

The information of 1 or 0 written in the transfer array SDA is, therefore, directly written in the light-emitting array LMA.

Thereafter, the voltage V$_{HR}$ is reset to be a value higher than the ON state maintaining voltage of the light-emitting element and lower than a voltage which is twice the voltage V$_{dif}$. As a result, the light-emitting element L is not influenced by the gate voltage of the transfer element S to keep holding the written information. While the light-emitting array LMA is kept in the information holding state, the next information is written in the transfer array SDA as in the same manner as described above.

Subsequently, the clock phi$_R$ is set at a low-level voltage to reset each light-emitting element L. After the elements are reset, information is written in the light-emitting array LMA. In this manner, a series of operations are repeatedly performed.

A case in which the light-emitting device shown in FIG. 21 is applied to a write light source of an optical printer will be described below.

Assuming that the light-emitting device has light-emitting elements L having 2,048 bits, transfer elements S require 4,096 bits which is twice that of the light-emitting elements L. Since a current amount of a write light source of an optical printer is about 5 mA, a current of about 10 A flows if the light-emitting elements L of all the bits are in a light emission state. It is experimentally found that a current required for information transfer from the transfer elements S is 0.5 mA when the pull-up resistor $R_{L3}$ is 30 kilo-ohms. Therefore, if the light-emitting elements L of all the bits are in a light emission state, the current is about 1 A.

It is noted that this current amount for information transfer is about 10% of a current of 10 A which is required for optical printing and therefore poses no practical problem.

By reducing the voltages of the transfer clocks $phi_1$ and $phi_2$ to be 0 V when information from the transfer element S is moved to the light-emitting element L, the entire transfer array SDA is set in an OFF state to perform resetting. When this method is used, a current amount is equivalently reduced if a time required for the transfer element S to be turned on is taken into consideration. That is, the current amount is equivalently reduced to be about 0.5 A from 1 A described above.

If only one data input terminal is provided to receive the start pulse $phi_s$ with respect to 2,048 bits of the light-emitting elements L, an information transfer rate must be considerably high. However, the information transfer rate can be decreased by providing a plurality of data input terminals. For example, a chip of the light-emitting elements L may be formed in units of 64 or 128 bits so that information is input to each chip.

When information is parallelly input in units of 128 bits, the number of data input terminals is 16 with respect to 2,048 bits. For this reason, the information transfer rate can be decreased to be 1/16. Therefore, the light-emitting device can operate with a sufficient time.

In order to prevent variations in light amounts of output light from the light-emitting elements L, the current limiting resistor $R_{L3}$ can be finely adjusted by using a laser or the like. As a result, a light-emitting device having no variation in light amounts of output light can be obtained.

In the arrangement shown in FIG. 21, the characteristics of the coupling diodes $D_{-2}$ and $D_0$ connected to the right side of even-number bits of the transfer array SDA are different from those of the coupling diodes $D_{-1}$ and $D_1$ connected to the right side of odd-number bits thereof. Therefore, it is important to use different operation currents and the like for the even-number and odd-number bits to optimize them. For this reason, $R_{L2} < R_{L1}$ and $R_{A1} < R_{A2}$ are preferably set. In this case, the light-emitting device can operate more stably at a higher speed.

Although the arrangement called a diode coupling system is used in FIG. 21, the coupling system is not limited to this one. For example, the resistor coupling system using the resistor $R_I$ as shown in FIG. 6 or the optical coupling system using a light emission function and light reception function of the transfer element S as shown in FIG. 8 may be used.

The number of transfer clocks is two (two phases) in FIG. 21, but three (three phases) or more clocks can be used. When the transfer element S is driven by three phases, the light-emitting element L of one bit corresponds to the transfer elements S of three bits.

A direct transition type semiconductor represented by GaAs is generally used to manufacture the light-emitting device as described above, but the material is not limited to this one.

FIG. 22 is a sectional view showing an arrangement in which the equivalent circuit shown in FIG. 21 is formed on a single semiconductor substrate. Referring to FIG. 22, reference numeral 371 denotes an n-type semiconductor substrate; 381, a p-type semiconductor layer; 382, an n-type semiconductor layer; and 383, a p-type semiconductor layer. The same reference numerals as in FIG. 21 denote the same parts.

The embodiment shown in FIG. 22 is characterized in that the transfer elements S, the coupling diodes $D_{-2}$ to $D_1$ and $D_{-2}'$ to $D_2'$, the light-emitting elements L and the like can be formed by a combination of the semiconductor layers 381, 382 and 383 and the semiconductor substrate 371. Therefore, the circuit arrangement shown in FIG. 21 can be integrally formed without complicating the manufacturing steps.

In the even transfer element $S(-2)$, the uppermost p-type semiconductor layer 381 serves as an anode, the n-type semiconductor layer 382 serves as the gate $G_{-2}'$ and the n-type semiconductor substrate 371 serves as a cathode. Two islands of the p-type semiconductor layer 381 formed on the n-type semiconductor layer 382 serve as the coupling diodes $D_{-2}$ and $D_{-2}'$ which have the same structure as that of the transfer element $S(-2)$ and are formed by exactly the same manufacturing steps as those of the transfer element $S(-2)$.

The light-emitting element $L(-2)$ has the same structure as that of the transfer element $S(-2)$ and is formed by the same manufacturing steps.

The resistors $R_{A1}$ to $R_{A3}$ and $R_{L1}$ to $R_{L3}$ can be formed by using a thin film resistor or by using the semiconductor layers 381, 382 and 383. Although a light-shielding layer is formed on the transfer elements S, it is not shown in FIG. 22. According to the structure shown in FIG. 22, the light-emitting device can perform exactly the same operation as described above with reference to FIG. 21.

In the structure shown in FIG. 22, a device having a mode utilizing natural light emission is exemplified as a light-emitting element. The device can operate without any problem by a mode using induction emission (i.e., a laser mode).

FIG. 23 is a plan view showing a planar structure of FIG. 22. In FIG. 23, the same reference numerals as in FIGS. 21 and 22 denote the same parts. As shown in FIG. 23, the transfer array SDA and the light-emitting array LMA are separately arranged in upper and lower portions. The resistors $RA_1$ to $R_{A3}$ and $RL_1$ to $RL_3$ are formed by a thin film resistor (the resistors can also be formed by using the semiconductor layers 381 to 383).

Although a light-shielding layer for shielding bias light is formed on the transfer elements S, it is not shown in FIG. 23.

Referring to FIG. 23, one light-emitting element L is provided for two transfer elements S, and a pitch of the light-emitting elements L is twice that of the transfer elements S. Therefore, in order not to decrease an integration degree, the transfer elements are arranged in two lines in a zig-zag manner. Alternatively, the pitch of the light-emitting elements L can be decreased by forming another transfer array SDA at the opposite side of the light-emitting array LMA.

In the above first to fourth embodiments, the semiconductor layers are stacked to form a pnpn structure from the upper portion. However, an npnp structure can similarly operate by inverting the polarities of an operation voltage, transfer clocks and the like.

In the above first to fourth embodiments. the pnpn thyristor arrangement is exemplified as a portion having a shift register function. However, an arrangement in which information transfer operation is performed by successive propagation of change in turn-on threshold level is not particularly limited as long as the arrangement can perform this function. For example, exactly the same shift register function can be achieved by using not the pnpn 4-layer arrangement but an arrangement having six or more layers.

In the first to fourth embodiments, the pnpn thyristor arrangement is exemplified. However, the same function can be achieved by using a static induction (SI) thyristor or a field-controlled thyristor (FCT).

In the above first to fourth embodiments, the grounded semiconductor substrate is used. However, the present invention is not limited to this, but another substance can be used as a substrate. For example, an n-type GaAs layer may be formed on a semi-insulating GaAs substrate doped with, e.g., chromium (Cr), and the structure of the first to fourth embodiments may be formed on this layer. Alternatively, a semiconductor film may be formed on an insulating substrate consisting of, e.g., glass or aluminum, and the structure of the first to fourth embodiments may be formed by using this semiconductor film.

As described above, in the light-emitting device of the fourth embodiment, a previously proposed self-scanning light-emitting device is used as a transfer array, and a light emission function is isolated to another light-emitting array having substantially the same structure. Therefore, a light-shielding layer can be formed on the transfer elements for transferring an ON state which causes bias light, thereby eliminating an influence of the bias light on an image information write operation. As a result, when the light-emitting device is applied to an optical printer or the like, the quality of the optical printer or the like can be improved.

In addition, a signal for writing image information is not carried on the clock lines as in a previously proposed technique but can be directly input in common with a start pulse to the transfer elements. Therefore, the arrangement of a driver can be simplified to reduce manufacturing cost.

Furthermore, since information written in the light-emitting element can be maintained until the element is reset by a scanning signal (clock $phi_R$), a duty cycle of light emission can be set to be substantially 1. Therefore, a current amount (peak value) to be flowed to the light-emitting element can be reduced to realize a long life of the light-emitting device.

It is noted that the light-emitting device having a light emission duty cycle of substantially 1 can be realized by comparatively simple manufacturing steps by forming a light-emitting array.

The light-emitting device of the fourth embodiment can be applied to a display or the like. In this case, the performance of such equipment can be largely improved and its manufacturing cost can be largely reduced.

Embodiment 5

Figure 24:
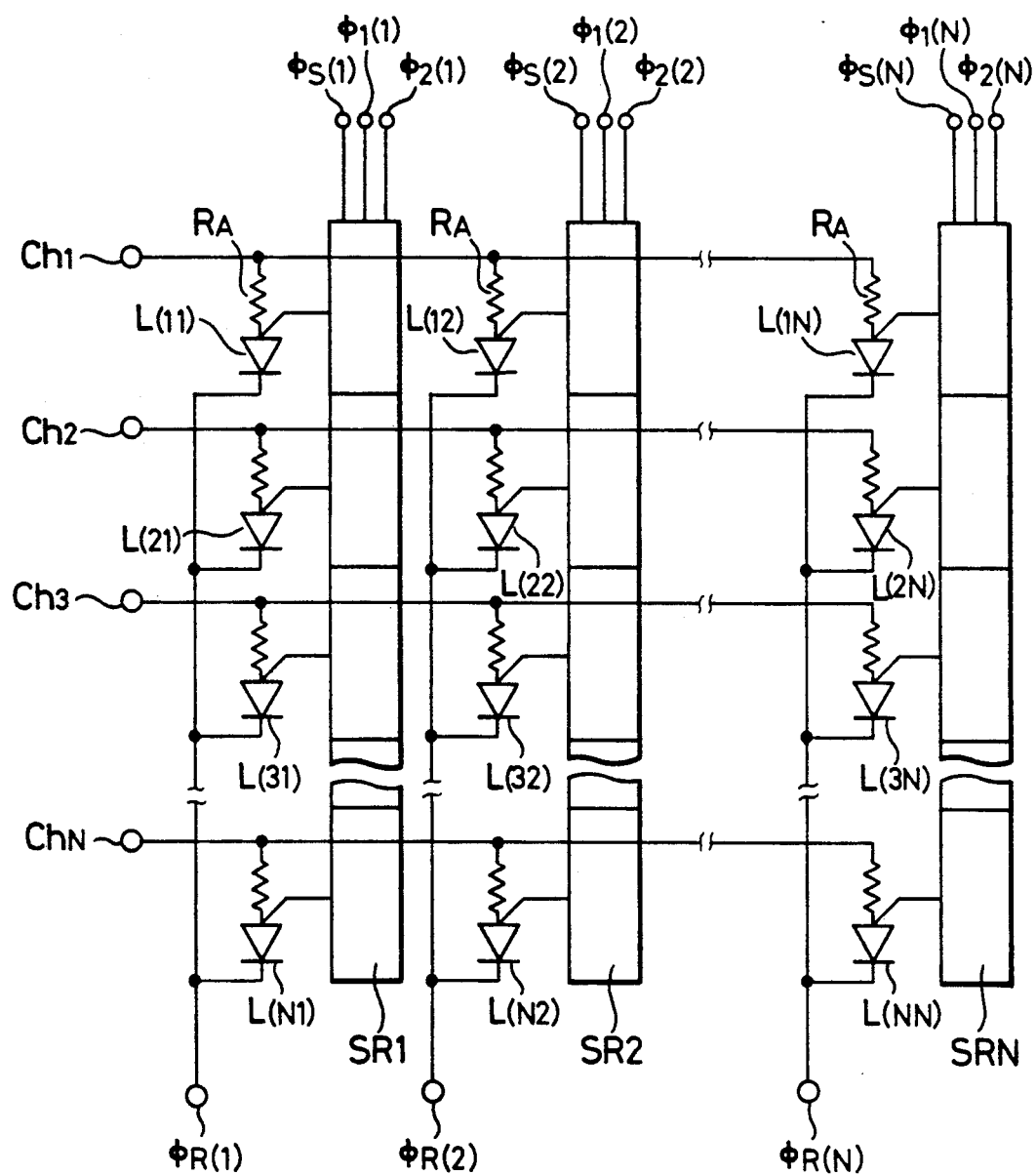
FIG. 24 is a circuit diagram showing an arrangement of the fifth embodiment of a light-emitting device of the present invention.

FIG. 24 is a circuit diagram showing the fifth embodiment of the present invention, in which the present invention is applied to an optical matrix transfer system. Referring to FIG. 24, reference symbols Ch1 to ChN denote channel numbers at a transmission side or lines and each for example extending along the row direction; $phi_S(1)$ to $phi_S(N)$, start pulses of transfer arrays SR1 to SRN each for example extending along the column direction and capable of sequentially, selectively transferring an ON state of a transfer element to the next transfer element; $phi_1(1)$ to $phi_1(N)$ and $phi_2(1)$ to $phi_2(N)$, transfer clocks; L(11) to L(NN), codes of matrix of light-emitting memory elements; RA, a current limiting resistor of each of the light-emitting memory elements L(11) to L(NN); and $phi_R(1)$ to $phi_R(N)$, column lines for reset pulses of the light-emitting memory elements each having a cathode connected thereto.

Figure 25:
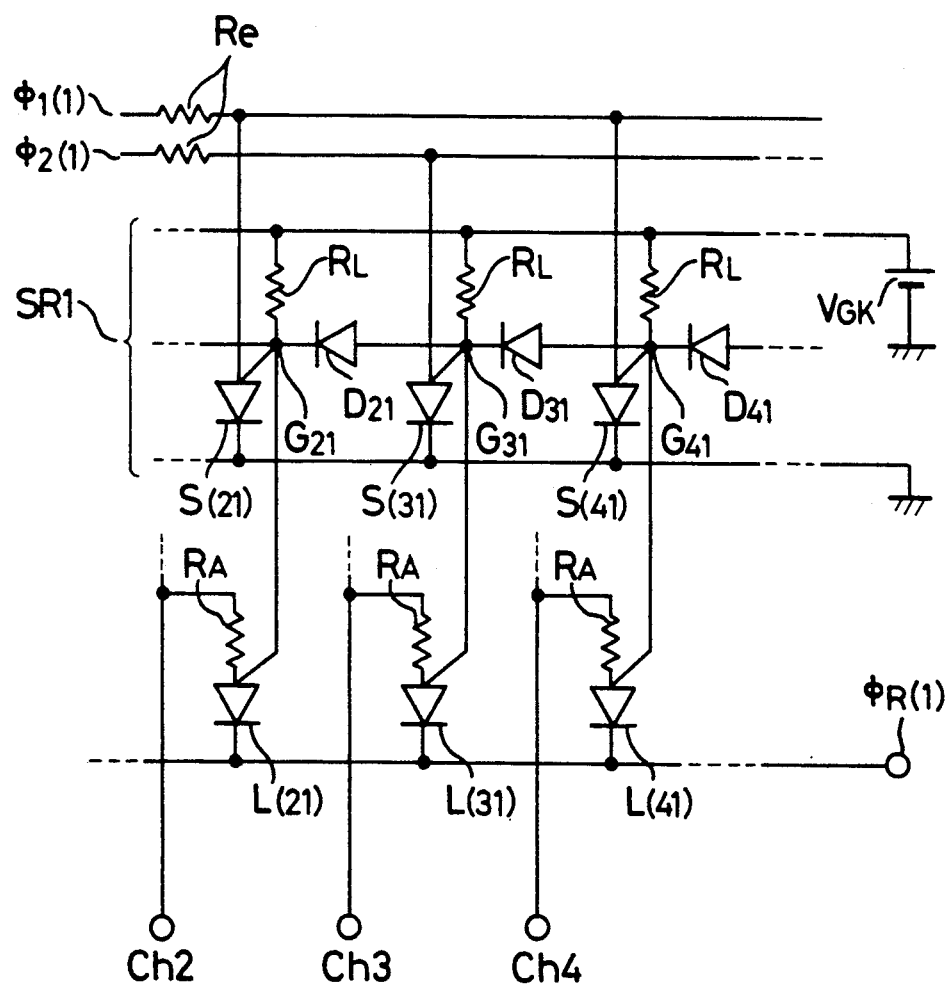
FIG. 25 is an equivalent circuit diagram of a part of FIG. 24.

FIG. 25 is an equivalent circuit diagram of the first column of light-emitting memory elements L(21), L(31) and L(41) and the corresponding transfer array SR1. The transfer array SR1 shown in FIG. 25 is obtained by connecting the adjacent transfer elements S(21) to S(41) by diodes D21 to D41. The transfer array SR1 performs a shift register operation by using two transfer clocks $phi_1$ and $phi_2$. The gate voltage of each of the transfer elements S(21) to S(41) is used as an output from the transfer array SR1. It is noted that the transfer elements S(21) to S(41) may be connected by the resistors $R_l$ instead of the diodes $D_{21}$ to $D_{41}$ as shown in FIG. 6.

When the transfer element S(31) (each transfer element is a thyristor) is turned on by the start pulse $phi_{s1}$ (FIG. 24), a gate potential $G_{31}$ is set at substantially 0 V. Since a gate potential $G_{21}$ of the transfer element S(21) connected via the diode $D_{21}$ is in a reverse direction of the diode, a bias voltage $V_{GK}$ (5 V) is applied as the potential by the resistor $R_L$. The gate $G_{41}$ connected via the diode $D_{31}$ is set at a voltage higher by a forward voltage $V_{dif}$ (about 1 V) of the diode, i.e., about 1 V. For this reason, the gate voltages of the light-emitting memory elements L(21), L(31) and L(41) are set at 5 V, 0 V and 1 V corresponding to the voltages of the gates $G_{21}$, $G_{31}$ and $G_{41}$ of the transfer elements S(21), S(31) and S(41), respectively. If the potential of the reset pulse $phi_R(1)$ of the light-emitting memory elements is set at 0 V, turn-on voltages of the light-emitting memory elements L(21), L(31) and L(41) are set at values higher than the respective gate potentials by $V_{dif}$, i.e., about 6 V, 1 V and 2 V, respectively. Therefore, by setting a DC voltage of Ch2 to Ch4 between 1 V and 2 V, only the light-emitting memory element L(31) corresponding to the transfer element S(31) which is turned on in the transfer array SR1. At this time, a current of the light-emitting memory element is limited by the resistor $R_4$. A light emission intensity of the light-emitting memory element L(31) is changed by a modulation signal superposed on the DC voltage of Ch3, and this changed light emission intensity is extracted as a light signal output.

Figure 26:
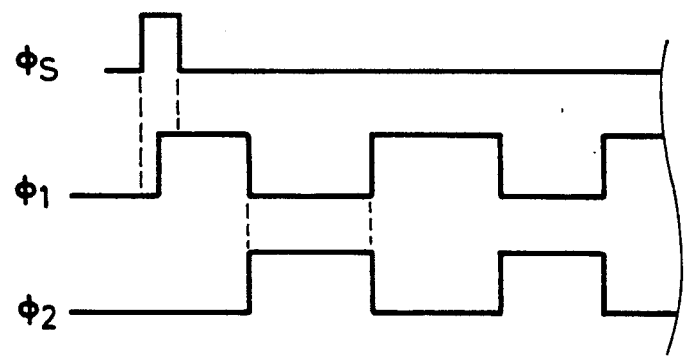
FIG. 26 is a pulse timing chart showing a start pulse and a transfer clock shown in FIGS. 24 and 25.

In order to switch the channels, the potential of the reset pulse $phi_R(1)$ of the light-emitting memory element is increased to be 2 V or more or the current is cut, thereby turning off the light-emitting memory element in an ON state. Thereafter, the transfer clocks $phi_1$ and $phi_2$ (the start pulse = 2 V) shown in FIG. 26 is applied to the signal line shown in FIG. 2 to turn off the transfer element S(31) and turn on the transfer element S(41). In this manner, this ON state can be sequentially transferred to a selected transfer element S(n1) in accordance with the number of pulses of the transfer clock. Thereafter, when the voltage of the reset pulse $phi_R(1)$ of the light-emitting memory element is set at 0 V again, a light-emitting memory element corresponding to the transfer element S(n1) to which the ON state is transferred is turned on. i.e., a light signal of the channel Chn can be extracted.

The above channel selection and switching can be independently performed for each transfer array SR1. Therefore, the N transfer arrays SR1 to SRN can be entirely independently operated.

Figure 27:
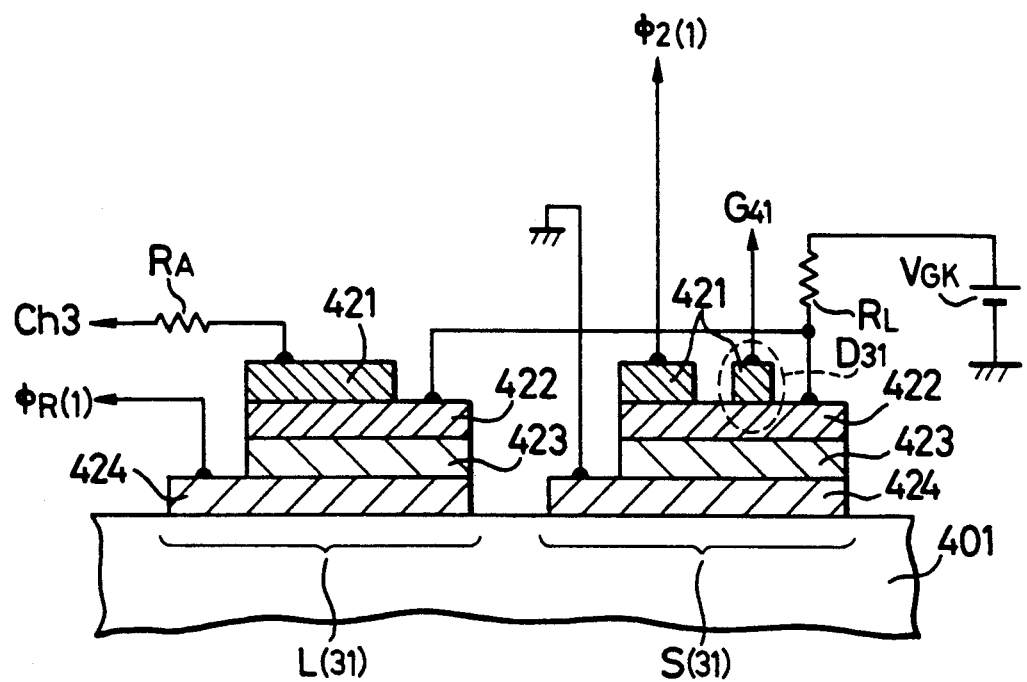
FIG. 27 is a sectional view showing a part of the equivalent circuit diagram shown in FIG. 25.

FIG. 27 shows the light-emitting memory element L(31) having the separate cathode layer 424 at left side, and the transfer element S(31) with the diode $D_{31}$ having the common cathode layer 424 at right side extending along row direction, as a unit of one pixel. The n-type epitaxial layer 424 is grown on the insulating GaAs substrate 401 by an MOVPE method or the like. A p-type epitaxial layer 423, an n-type epitaxial layer 422 and a p-type epitaxial layer 421 are grown on the layer 424 to form a pnpn thyristor structure. After formation of the layers, the structure shown in FIG. 27 is formed by a method such as photoetching. The coupling diode is formed by using the layers 421 and 422 of the transfer element S(31). A wiring for connecting these elements is formed of a metal such as aluminum or gold, and the resistors $R_L$ and $R_4$ are formed by using. e.g., a mixture of Cr and SiO. As is apparent from FIG. 27, since the light-emitting memory element and the thyristor, the diode and the like for the transfer element can be formed on the same substrate, a light-emitting memory element can be formed with high reliability at low cost.

In this embodiment, a thyristor structure is exemplified as the light-emitting memory element and a basic constituting element of the shift register. However, the present invention is not limited to this structure. For example, exactly the same function can be obtained by a pnpnpn structure constituted by three p-n structures, and the device similarly operates with four or more p-n structures.

In this embodiment, in place of the pnpn thyristor structure, an element called a static induction thyristor (FCT: Field-Controlled Thyristor, S.M.Sze, Physics of Semiconductor Devices, 2nd edition, pp. 238 to 240) in which a depletion layer is used instead of an internal p- or n-type semiconductor layer to obtain substantially the same switching characteristics as those of a thyristor can be used.

Although a GaAs substrate is used in this embodiment, another substrate such as an InP or ZnSe substrate can be used to change a light emission wavelength. That is, this embodiment is not limited to materials to be used.

Applications

A transfer system is a necessary device in order to arbitrarily select a channel between a plurality of transmitters and a plurality of receivers. An electric transfer system has, however, a complicated wiring, and the wiring serves as an antenna at an RF frequency to produce crosstalk. In recent years, therefore, a transfer system using light has attracted attention.

Figure 28:
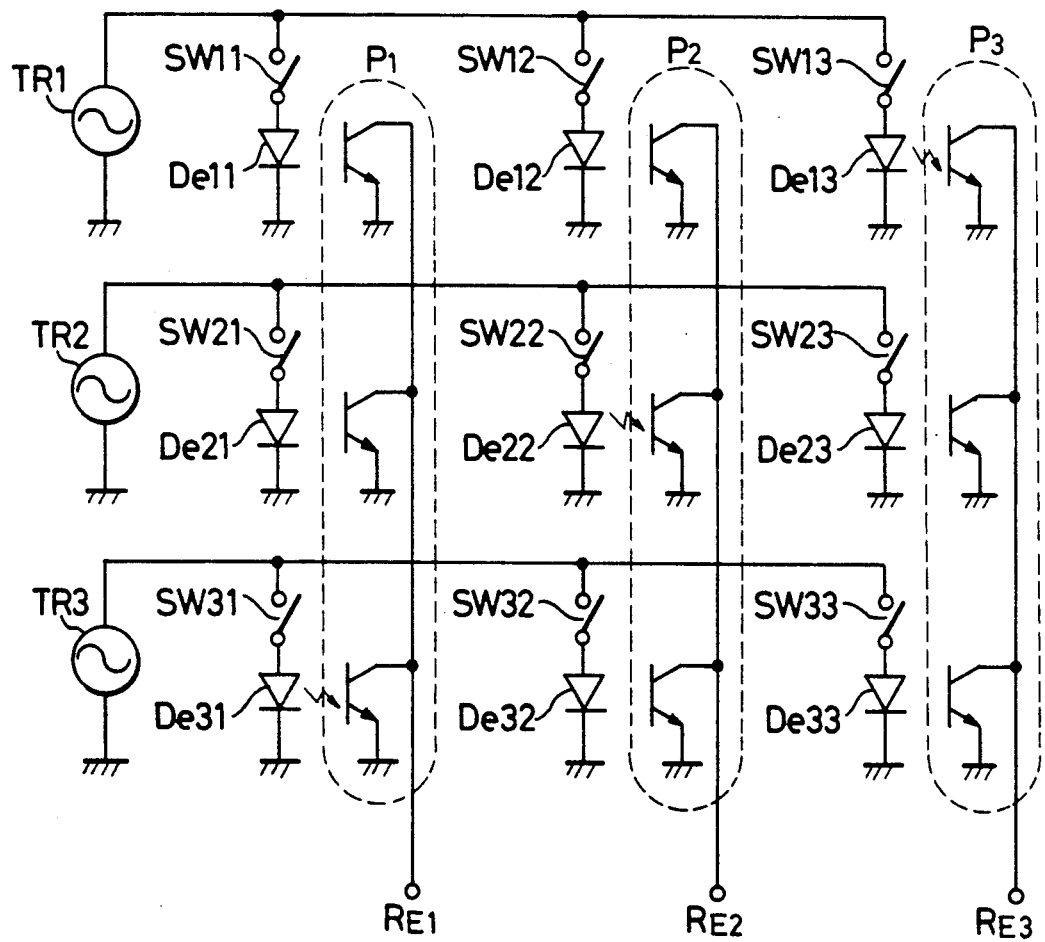
FIG. 28 is an equivalent circuit diagram of a light-emitting array in a conventional optical transfer system.
Figure 29:
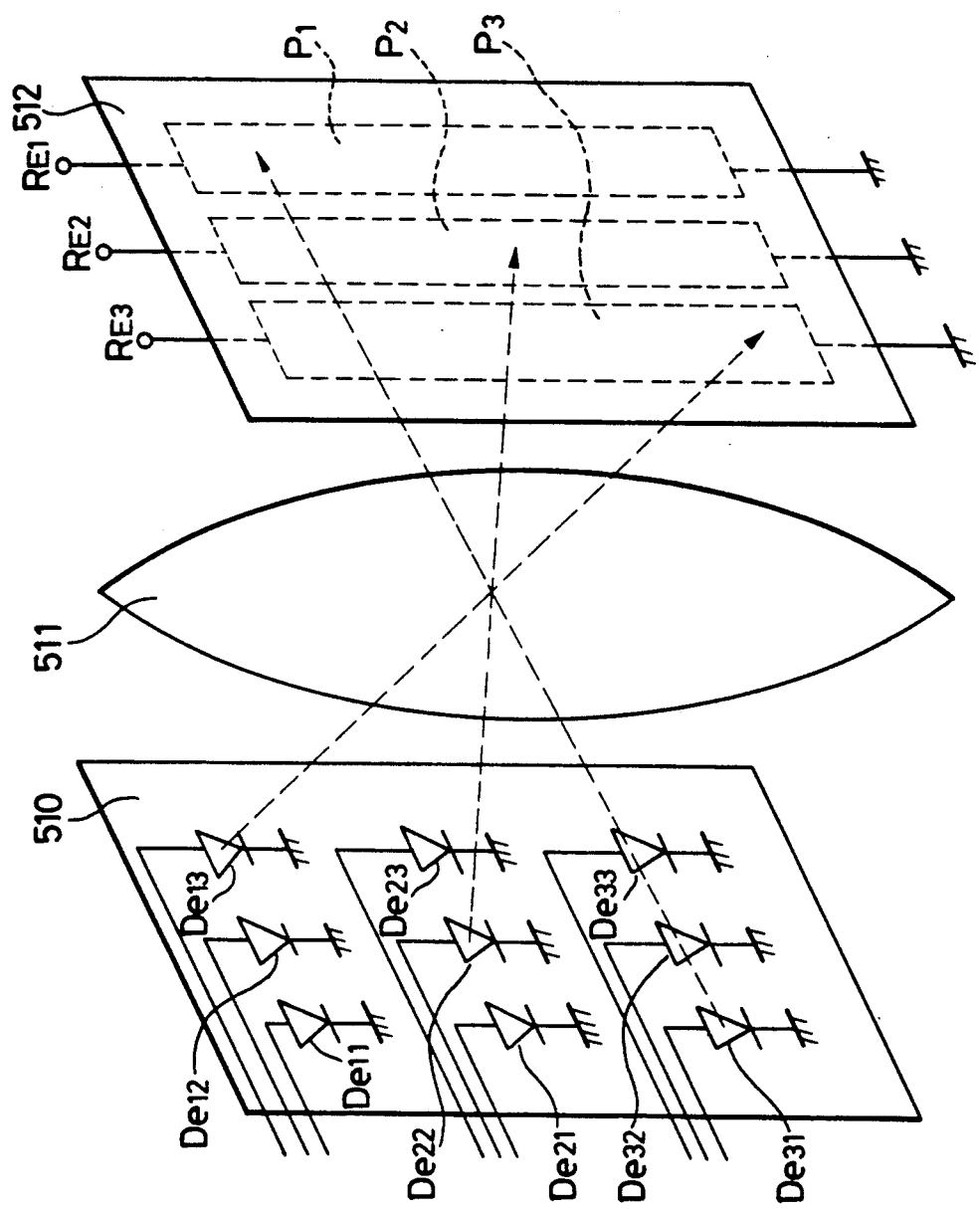
FIG. 29 is a view showing an example of a conventional optical transfer system.

FIGS. 28 and 29 show a conventional arrangement of such an optical transfer system and a simplest arrangement of a transfer system for three transmitters x three receivers in order to explain an operation principle. Referring to FIGS. 28 and 29, reference symbols TR1, TR2 and TR3 denote transmitters; RE1, RE2 and RE3, receivers; De11 to De33; light-emitting diodes; and P1, P2 and P3, light-receiving transistors. The light-emitting diodes are selected by switches SW11 to SW33. In FIG. 29, reference numeral 510 denotes a light-emitting diode array; 511, a lens; and 512, a light-receiving transistor array. The light-emitting diodes are arranged in one-to-one correspondence with light-receiving positions.

As one function required for this optical transfer system, a receiver must independently select a desired transmitter. In FIG. 28, this function can be achieved by independently select the switches SW11 to SW33.

It is, however, difficult to form the switches SW11 to SW33 and the light-emitting diodes on the same substrate. For this reason, another transfer array is formed close to the light-emitting diodes and connected to the diodes by a technique such as bonding, or terminals of the light-emitting diodes are extracted outside to be electrically connected. In the former arrangement, not only an area of the light-emitting diode array is increased but also assembly cost is increased. In the latter arrangement, since an amount of wiring to be extracted outside is increased as the number of light-emitting elements is increased, practical numbers of the light-emitting elements and the channels are limited.

In order to eliminate the above drawbacks, the above fifth embodiment can be applied. This application is shown in FIG. 30.

Figure 30:
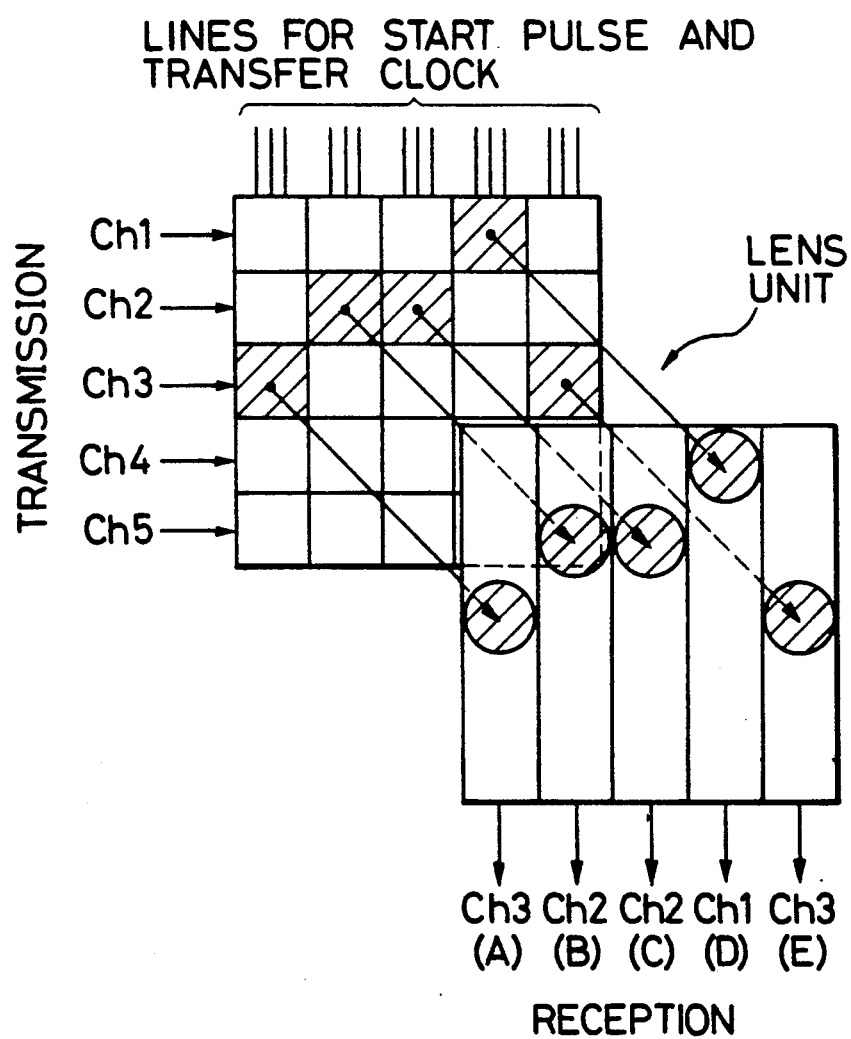
FIG. 30 is a view showing an optical transfer system adopting the fifth embodiment of the present invention.

FIG. 30 shows an arrangement of this application having a combination of a light-emitting memory array and a photodiode array as a light-receiving array. In this arrangement, the number of channels is five. Signals are transmitted from a transmitter side through channels Ch1 to Ch5, and the number of receivers is five, A to E. Although the numbers of transmitters and receivers are the same in this arrangement, the numbers may be different. A lens system is not shown in FIG. 30, but it is arranged to focus the light output from the transmitter side onto a corresponding position of the receiver side. The receivers independently select desired channels. Selection from the channels Ch1 to Ch5 is performed by using a transfer clock applied to the transfer arrays SR1 to SR5 as described above. As shown in FIG. 30, a plurality of receivers can select the same channel.

The arrangement of this application requires the same number of transfer arrays as that of receivers and the same number of channels as that of transmitters. Therefore, the number of signal lines including a power source line and a ground (GND) line required for the light-emitting memory array of this application is:

$$\text{the number of transmitters} - \text{the number of receivers} \cdot (3-1) = 2$$

That is, a required number of signal lines at the transmitter side is the number of transmitters, and lines at the receiver side are a start pulse line, two transfer clock lines, and a reset pulse line of the light-emitting memory element per receiver. In addition, a power source line and a ground line are required. The number of signal lines required for the conventional light-emitting array shown in FIGS. 28 and 29 is:

$$\text{the number of transmitters} \times \text{the number of receivers} - 1$$

because all the terminals of the light-emitting diodes must be extracted outside.

Assuming that the number of transmitters is 10 and the number of receivers is 10, the numbers of signal lines are:

This application = 52
The conventional arrangement = 101

That is, the number of signal lines of this application is about half that of the conventional arrangement. This difference is increased as the number of channels is increased. Therefore, the light-emitting memory array according to this application has an effect in a large amount of signal transferring.

The application of the fifth embodiment is not limited to the combination of a light-emitting array and a light-receiving array. For example, the fifth embodiment can be applied to an arrangement in which an output from a light-emitting memory element is supplied to an optical fiber or the like.

What is claimed is:

1. A light-emitting device comprising:
   a plurality of light-emitting cells having a common substrate electrode, each having a common gate and each aligned along a row direction, said light-emitting cell including:
   a transfer element having a current electrode and said common gate;
   coupling means in conjunction with said common gate and connected between said common gates of one cell and the next;
   a light-emitting element having said common gate and another current electrode;
   at least two transfer clock lines each connected to said current electrode of said transfer elements in every at least second fashion to provide a self-scanning function therefor;
   a signal line connected to said another current electrode of said light-emitting element for receiving a light emission control current for light emission thereof;
   a bias line;
   a plurality of pull-up means each connected between said common gate and said bias line.

2. A device according to claim 1, wherein a binary current supply means corresponding to light emission/non-light emission is connected to signal line.

3. A device according to claim 1, wherein an analog current supply means for controlling luminance of light emission by an analog value is connected to said signal line.

4. A device according to claim 1, wherein said light-emitting element consists of a 3-terminal negative resistive element in which a plurality of p- and n-type semiconductor regions are stacked, and said current electrode being an anode.

5. A device according to claim 4, wherein said transfer element consists of a 3-terminal negative resistive element in which a plurality of p- and n-type semiconductor regions are stacked and on which a light-shielding layer for shielding radiation of light is formed.

6. A device according to claim 1, further comprising current supply means for supplying the light emission current to said another current electrodes of said light-emitting elements in synchronism with a turn-on transfer timing of said transfer array driven by said drive means.

7. A device according to claim 6, wherein the light emission current includes a turn-off pulse for biasing each light-emitting element in an OFF state after said light-emitting element emits light in synchronism with turn-on transfer of said transfer array.

8. A device according to claim 5, wherein said coupling means has uni-directivity for regulating the change in threshold level to one direction of said transfer array.

9. A device according to claim 1, wherein said coupling means comprises a resistor.

10. A device according to claim 1, wherein said coupling means comprises a diode.

11. A device according to claim 1, further comprising a start transfer element having a gate connected to said gate of said transfer element via said coupling means, and an anode for receiving a start signal; and
    a pull-up means connected between said gate and said bias line.

12. A light-emitting device comprising:
    a plurality of light-emitting blocks each aligned along a row direction, said light-emitting block including:
    a transfer element having a current electrode, a gate and a common electrode extending along said row direction;
    coupling means in conjunction with said gate and connected between said gates of one transfer element and the next;
    a light-emitting element isolated from said transfer element and having another gate operatively connected to said gate of said transfer element and another current electrode;
    at least two transfer clock lines each connected to said current electrode of said transfer element in every at least second fashion to provide a self-scanning function therefor;
    a signal line connected to said another current electrode of said light-emitting element for receiving a light emission current for light emission thereof;
    a bias line; and
    a plurality of pull-up means each connected between said gate of said transfer element and said bias line.

13. A device according to claim 12, wherein said light-emitting block includes:
    odd and even transfer elements;
    odd and even coupling means in conjunction with said gates of said transfer elements respectively; and
    a light-emitting element isolated from said transfer elements and having another gate operatively connected to said gate of said even transfer element via another coupling means.

14. A device according to claim 12, further comprising:
    a write array of write switching elements each connected between an image signal line and said gate of said light-emitting element and turning on under a control of said transfer element; and
    a reset array of reset switching elements each connected between a reset line and said current electrode of said light-emitting element and turning on under a control of said transfer element.

15. A device according to claim 12, further comprising a write array of write switching elements having a number corresponding to that of said transfer elements, and
    wherein said write switching element is energized in response to a turn-on signal from said transfer element at the same column to supply an image signal to the gate of said light-emitting element at the same column to turn on said light-emitting element which maintains the ON state itself.

16. A device according to claim 15, further comprising a reset array having a line of reset switching elements corresponding to said transfer elements, and wherein said reset switching element is energized in response to said turn-on signal from said transfer element at the same column to supply a turn-off reset signal to said current electrode of said light-emitting element at the next column.

17. A device according to claim 16, wherein said switching element is a transistor.

18. A device according to claim 12, further comprising a plurality of rows extending along a column direction and each having a said plurality of said light-emitting blocks each having said light-emitting element L(NN) where N is a positive integer;
a plurality of said write signal channel lines Ch(N) each extending along said column direction and said channel line Ch(N) being connected to said current electrodes of said light-emitting elements L(N1) to L(NN); and
a plurality of reset lines $phi_R(N)$ each extending along row direction and said reset line $phi_R(N)$ being connected to electrodes of said light-emitting elements L(1N) to L(NN).

19. A device according to claim 18, wherein said plurality of said rows are arranged on a two-dimensional plane, said channel lines constituting a plurality of transmission channels, and
a plurality of elongated light-receiving sensors each having a region including one of said light-emitting arrays are formed to oppose said light-emitting arrays, said light-receiving sensors corresponding to a plurality of reception channels.

20. A device according to claim 19, wherein the numbers of said transmission channels and said reception channels are the same.

* * * * *